US008888950B2

(12) United States Patent
Lee et al.

(10) Patent No.: US 8,888,950 B2
(45) Date of Patent: Nov. 18, 2014

(54) APPARATUS FOR PLASMA PROCESSING AND METHOD FOR PLASMA PROCESSING

(75) Inventors: Kyung Ho Lee, Gyeonggi-Do (KR); Jae Ho Guahk, Gyeonggi-do (KR); Jae Chul Choi, Gyeonggi-do (KR); Young Ki Han, Seoul (KR); Hee Se Lee, Gyeonggi-do (KR); Yong Hwan Lim, Jeollabuk-Do (KR); Kwan Goo Rha, Gyeonggi-do (KR); Seng Hyun Chung, Gyeonggi-do (KR); Sun Q Jeon, Gyeonggi-do (KR); Jung Hee Lee, Incheon (KR)

(73) Assignee: Charm Engineering Co., Ltd. (KR)

( * ) Notice: Subject to any disclaimer, the term of this patent is extended or adjusted under 35 U.S.C. 154(b) by 863 days.

(21) Appl. No.: 12/528,326

(22) PCT Filed: Mar. 13, 2008

(86) PCT No.: PCT/KR2008/001430
§ 371 (c)(1),
(2), (4) Date: Aug. 23, 2009

(87) PCT Pub. No.: WO2008/114958
PCT Pub. Date: Sep. 25, 2008

(65) Prior Publication Data
US 2010/0059478 A1 Mar. 11, 2010

(30) Foreign Application Priority Data

| Mar. 16, 2007 | (KR) | 10-2007-0025874 |
| Apr. 13, 2007 | (KR) | 10-2007-0036576 |
| Apr. 13, 2007 | (KR) | 10-2007-0036577 |
| Apr. 13, 2007 | (KR) | 10-2007-0036578 |
| Apr. 13, 2007 | (KR) | 10-2007-0036579 |

(51) Int. Cl.
*C23F 1/00* (2006.01)
(Continued)

(52) U.S. Cl.
CPC .... *H01L 21/67069* (2013.01); *H01L 21/68742* (2013.01); *H01J 37/32431* (2013.01); *H01L 21/0209* (2013.01); *H01J 2237/20* (2013.01); *H01L 21/68735* (2013.01)
USPC ............. 156/345.43; 156/345.33; 118/723 E

(58) Field of Classification Search
USPC ............. 156/345.43–345.47, 345.33, 345.34; 118/715, 722, 723 R, 723 E
See application file for complete search history.

(56) References Cited

U.S. PATENT DOCUMENTS

| 5,213,650 A | 5/1993 | Wang et al. |
| 5,772,771 A * | 6/1998 | Li et al. ........................ 118/723 I |

(Continued)

FOREIGN PATENT DOCUMENTS

| JP | 397869 | 4/1991 |
| JP | 03097869 | 4/1991 |

(Continued)

OTHER PUBLICATIONS

English Machine Translation of JP 05-003176. Obtained from http://www19.ipdl.inpit.go.jp/PA1/cgi-bin/PA1DETAIL on Aug. 15, 2012.*

Primary Examiner — Maureen Gramaglia

(57) ABSTRACT

There is provided a substrate supporter capable of securely supporting a substrate such as a wafer on which a device having a predetermined thin film pattern is formed to remove various impurities formed on the rear surface of the substrate, and a plasma processing apparatus having the same. The plasma processing apparatus includes: at least one arm; and a supporting portion extending from the arm toward a substrate seating position of the substrate, so that the plasma processing apparatus can reduce the likelihood of arc discharges compared with conventional dry etching to increase process yield and product reliability, and ensure stable mounting of a substrate.

9 Claims, 22 Drawing Sheets

(51) Int. Cl.
*H01L 21/306* (2006.01)
*H01L 21/687* (2006.01)
*H01J 37/32* (2006.01)
*H01L 21/67* (2006.01)
*H01L 21/02* (2006.01)

(56) References Cited

U.S. PATENT DOCUMENTS

| 6,676,760 B2 * | 1/2004 | Kholodenko et al. ........ 118/728 |
| 2006/0237138 A1 * | 10/2006 | Qin ........................... 156/345.51 |
| 2008/0069951 A1 * | 3/2008 | Chacin et al. .............. 427/248.1 |

FOREIGN PATENT DOCUMENTS

| JP | 03-228321 | 10/1991 |
| JP | 05-003176 | 1/1993 |
| JP | 05-175162 | 7/1993 |
| JP | 5299377 | 11/1993 |
| JP | 9283459 | 10/1997 |
| JP | 10165884 | 6/1998 |
| JP | 11016893 | 1/1999 |
| JP | 11087319 | 3/1999 |
| JP | 11297672 | 10/1999 |
| JP | 2001-144072 | 5/2001 |
| JP | 2001326267 A | 11/2001 |
| JP | 2002280318 A | 9/2002 |
| JP | 2002-367967 | 12/2002 |
| JP | 2004-022821 | 1/2004 |
| JP | 2004281528 A | 10/2004 |
| JP | 2006-319043 | 11/2006 |
| JP | 2007043148 A | 2/2007 |
| KR | 10-2002-0020084 A | 3/2002 |
| KR | 200349874 | 5/2004 |
| KR | 100524881 B1 | 10/2005 |

\* cited by examiner

Fig. 49

|  |  | S1 | S2 | S3 | S4 | S5 | S6 | S7 | S8 | S9 | S10 | S11 | S12 | S13 | S14 | S15 | S16 | S17 |
|---|---|---|---|---|---|---|---|---|---|---|---|---|---|---|---|---|---|---|
| High-frequency power | ON/OFF | | | | | | | | | | ON | | | | | | | |
| Pressure | Atmospheric pressure / Vacuum | | | Atm | | | | | | | Atm | | | | | Atm | | |
| Purge valve | Open/Close | | Open | | | | | | | | | | | | | Open | | |
| Process gas | Open/Close | | | | | | | Open | Open | Open | Open | | | | | | | |
| Inert gas | Open/Close | | | | | Open | Open | Open | Open | Open | Open | Open | Open | | | | | |
| Gap | High/Low | | | | | | Low | Low | Low | Low | Low | Low | Low | | | | | |
| Substrate supporter | High/Low | | | Low | Low | Low | | | | | | | | | Low | Low | Low | |
| Opening/closing unit | Open/Close | | | Open | | | | | | | | | | | | Open | | |

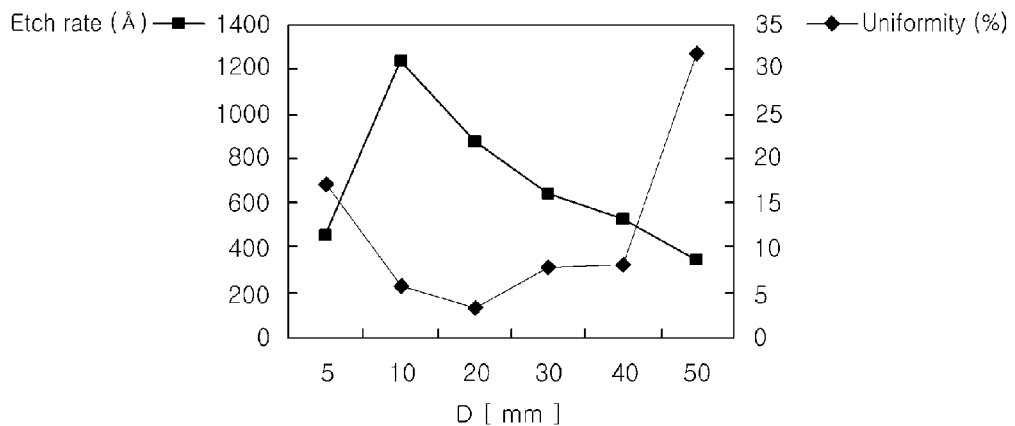

Fig. 50

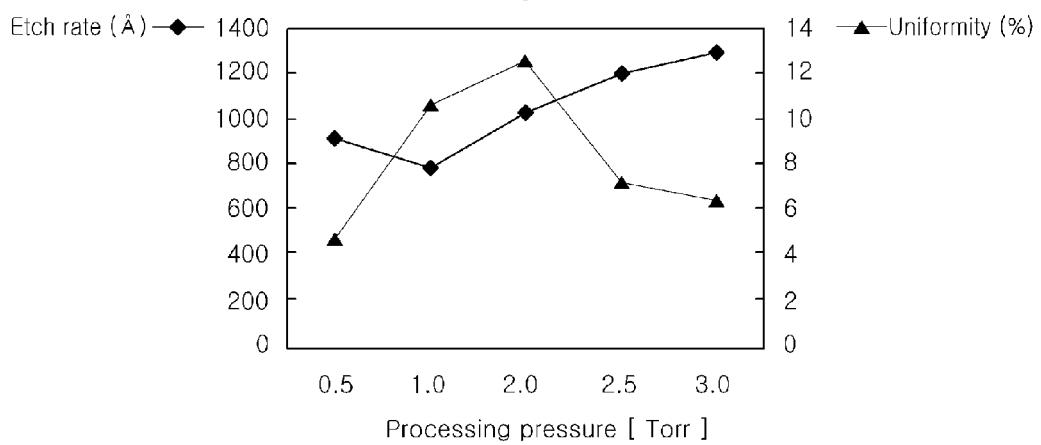

Fig. 51

APPARATUS FOR PLASMA PROCESSING AND METHOD FOR PLASMA PROCESSING

TECHNICAL FIELD

The present disclosure relates to a substrate supporter and a plasma processing apparatus having the same, and more particularly, to a substrate supporter that securely supports a substrate such as a wafer on which a device having a predetermined thin film pattern is formed to remove various impurities formed on the undersurface of the substrate, and to a plasma processing apparatus having the substrate supporter.

BACKGROUND ART

A semiconductor device and a flat panel display device are formed through deposition and etching of a plurality of thin films on a substrate. That is, a thin film is deposited in a predetermined region, generally in the central region, on a substrate, and a portion of the thin film in the central region of the substrate is removed by an etching process using an etching mask, whereby a device having a predetermined thin film pattern is manufactured.

However, during deposition of a thin film, because the thin film is formed on the entire surface of the substrate, and the thin film in only the central region of the substrate is targeted for etching, the thin film on the edges of the substrate is not removed and is left remaining, and particles accumulate on the edges of the substrate during etching. Moreover, because substrate supporters that support substrates typically employ electrostatic power or negative pressure to mount a substrate, the interface between the substrate and the substrate supporter is separated and develops gaps that cause particles and thin film to accumulate on the entire undersurface of the substrate.

Thus, when further processes are performed without removing the particles remaining on the substrate and the accumulated thin film, various unfavorable conditions may arise, such as warping of the substrate and the substrate becoming difficult to align.

Typically, methods for removing the above particles and accumulated thin film include wet etching that removes particles from a surface by immersing the latter in a solvent or rinse, and dry etching that removes depositions by etching a surface with plasma.

While wet etching is used to effectively remove particles deposited on a substrate surface, difficulties in process control substantially restrict localized removal from the undersurface of the substrate, and extensive use of processing chemicals increases fabrication cost and exacerbates waste disposal and environmental issues. Further, larger-scale equipment must be used when extensive processing time is required. Conversely, when dry etching using plasma is employed to remove thin films or particles on and under a substrate, the above-described limitations of wet etching may be resolved.

Accordingly, development of dry etching apparatuses for etching substrate undersurfaces is being intensely pursued.

Specifically, a related art plasma etching apparatus employing plasma to etch substrate undersurfaces is disclosed in U.S. Pat. No. 5,213,650, which is hereby incorporated in its entirety by reference.

In the above U.S. Pat. No. 5,213,650, an apparatus with a vacuum chamber is provided. Here, a space is defined between a plate and the front surface of a wafer, and reactive gas is discharged into the space. Plasma is generated at the rear surface of the wafer to perform etching.

In the above configuration, in order to support a wafer, when a lift pin is employed to support a substrate, the lift pin is disposed in the processing region on the rear surface of the substrate to induce an arc discharge during processing, so that the processing is impeded or the substrate can be damaged.

Furthermore, when a plurality of lift pins is used to support a substrate as in the above, the supported portions of the substrate, that is, the rear surface of the substrate in contact with the lift pins, are not etched. When subsequent processes are performed without etching of these areas, this may cause defects in the final product, or a separate etching process is required for the areas that have not been etched.

In addition, when a wafer is supported by only a lower pin, it is difficult to ensure stable mounting of the wafer, so that the wafer may be separated from the pin when subjected to vibrations.

In the above configuration, however, reactive gas is discharged into a space defined between a wafer and a plate, and etching is performed with plasma formed at a rear surface of the wafer. At the same time, plasma formed at the rear surface of the wafer is admitted to a front surface of the wafer with a thin film pattern, etc. formed thereon, or plasma is formed through gas discharge within that space to perform etching.

Accordingly, due to the etching of the front surface of the wafer, yield of finished products decreases and the rate of defects increases, or a separate member for protecting the front surface of the wafer from being etched is required to obviate the above.

DISCLOSURE OF INVENTION

Technical Problem

The present disclosure provides a substrate supporter and a plasma processing apparatus having the same that employ an apparatus that is smaller than one used for wet etching, which perform expedient etching, reduce fabrication cost, and do not produce environmentally harmful waste products.

The present disclosure also provides a substrate supporter and a plasma processing apparatus having the same that reduce the likelihood of arc discharges compared with conventional dry etching to increase process yield and product reliability, and ensure stable mounting of a substrate.

The present disclosure also provides a plasma processing apparatus that efficiently protects surfaces of a substrate that do not require etching, when compared to the related art, thereby increasing final product yield and preventing the occurrence of defects.

Technical Solution

In accordance with an exemplary embodiment, a substrate supporter includes: at least one or more arms configured to seat a substrate on; and a supporting portion extending from the arm toward a seated position of the substrate.

The arm may be provided in at least triplicate or more, and the arms may be equiangular to one another with respect to a center of the substrate.

The supporting portion may include a supporting ring connecting the arms, and the supporting ring may form an open curvature. Here, the substrate supporter may further include an auxiliary ring capable of being disposed at an opening of the open curvature of the supporting ring, and an auxiliary arm connected to the auxiliary ring, the auxiliary arm may be formed in the same direction as the arm or in a different direction, and the auxiliary arm may be driven separately from the arm.

Furthermore, the supporting ring may include a plurality of supporting pins extending toward the seated position of the substrate, the supporting ring may further include a stepped portion with slopes formed toward the substrate, the supporting pins formed at lower portions of the stepped portion, and the supporting pins may extend approximately 1 mm to approximately 3 mm from ends of the stepped portion with the slopes formed thereon.

The supporting ring may have a top portion that is higher than a top portion of the substrate in the seated position of the substrate, the supporting pins may include protrusions thereon perpendicular to extending directions of the supporting pins and protruding toward a rear surface of the substrate, and the protrusions may have a height of approximately 0.5 mm to approximately 1 mm high.

Preferably, the protrusions may include pointed portions contacting the rear surface of the substrate.

In accordance with another exemplary embodiment, a plasma processing apparatus includes: a first electrode to which a first gas is discharged; a substrate supporter separated from the first electrode and supporting a substrate; and a second electrode disposed apart from the substrate supporter, the second electrode to which power is applied and a second gas is discharged to form plasma between the second electrode and the substrate supported by the substrate supporter.

The plasma processing apparatus may further include a driving member provided on the substrate supporter to adjust a distance between the substrate supporter and the first electrode, and the arm of the substrate supporter may extend from the first electrode or extends from the second electrode.

In accordance with an exemplary embodiment, a plasma processing apparatus includes: a first electrode to which a first gas is discharged; a substrate supporter separated from the first electrode and supporting a substrate; and a second electrode disposed apart from the substrate supporter, the second electrode to which power is applied and a second gas is discharged to form plasma between the second electrode and the substrate supported by the substrate supporter, the second electrode discharging a third gas to confine the second gas.

The first gas may be a nonreactive gas including hydrogen or inert gas, the second gas may be a reactive gas including a fluoride-based gas or an oxygen-based gas, and the third gas may be a reactive gas or a nonreactive gas.

The second electrode may defines a plurality of discharging nozzles discharging the second gas toward the substrate, and the second electrode may include a discharging member formed thereon to discharge the third gas from an outer periphery of the second electrode obliquely toward a central portion of the second electrode.

The discharging member may be formed in a curvature to discharge the third gas obliquely, the discharging member may extend beyond the second electrode toward the first electrode, the discharging member may have an expanding discharging end, and the discharging member may be sloped toward the central portion of the second electrode.

The discharging member may include a plurality of discharging parts formed thereon extending toward the central portion of the second electrode.

The plasma processing apparatus may further include an auxiliary discharging member provided at an outer periphery of the discharging member, the auxiliary discharging member discharging a fourth gas toward the central portion of the second electrode, and the fourth gas may be a nonreactive gas.

Further, the substrate supporter may include a discharging portion discharging a fifth gas toward the second electrode, and the fifth gas may be a nonreactive gas.

In accordance with another exemplary embodiment, a plasma processing apparatus includes: a first electrode to which a first gas is discharged; a substrate supporter separated from the first electrode and supporting a substrate; and a second electrode disposed apart from the substrate supporter, the second electrode to which power is applied and a third gas is discharged to form plasma between the second electrode and the substrate supported by the substrate supporter.

The third gas may include a fluoride-based gas or an oxygen-based gas.

Also, the second electrode may include a discharging member formed thereon to discharge the third gas from an outer periphery of the second electrode obliquely toward a central portion of the second electrode.

In accordance with an exemplary embodiment, a plasma processing apparatus includes: a first electrode to which a first gas is discharged; a substrate supporter separated from the first electrode and supporting a substrate; and a second electrode disposed apart from the substrate supporter, the second electrode to which power is applied and a second gas is discharged to form plasma between the second electrode and the substrate supported by the substrate supporter.

The plasma processing apparatus may further include a driving member provided on the first electrode or the substrate supporter to variably adjust a distance between the first electrode and the substrate supporter.

The first gas may be a nonreactive gas including hydrogen, nitrogen, or an inert gas.

The first electrode may define a plurality of discharging nozzles to discharge the first gas onto the substrate.

The first electrode may define a discharging nozzle to induce a flow of the first gas toward an outer periphery of the substrate, the discharging nozzle may be communicated with a supply nozzle supplying the first gas to the first electrode, and the discharging nozzle of the first electrode may define a slope from the supply nozzle toward the outer periphery of the substrate. Here, the slope may be 7° or less.

The discharging nozzle of the first electrode may expand or contract toward the outer periphery of the substrate, and the expanded or contracted angle may be 7° or less.

Preferably, the discharging nozzle of the first electrode may branch in plurality from the supply nozzle to be equiangular from the supply nozzle, or may be formed in an annular shape concentrically around the supply nozzle.

Also, the discharging nozzle of the first electrode may include a first discharging nozzle branching from the supply nozzle at a first branching point farther away from the substrate, and a second discharging nozzle branching from the supply nozzle at a second branching point closer to the substrate.

The first discharging nozzle branching from the first branching point may have a diameter greater than the second discharging nozzle branching from the second branching point, the first discharging nozzle branching from the first branching point may discharge the first gas further toward the outer periphery of the substrate than the second discharging nozzle branched from the second branching point, and the first discharging nozzle or the second discharging nozzle may branch in plurality from the supply nozzle to be equiangular from the supply nozzle, or may be formed in an annular shape concentrically around the supply nozzle.

Preferably, the supply nozzle may have a constricting diameter from the first branching point to the second branching point.

The first discharging nozzle or the second discharging nozzle may expand or contract toward the outer periphery of the substrate.

Also, the substrate supporter may extend from a top or a bottom of the chamber and include an arm capable of being raised and lowered to support the substrate with, or the substrate supporter may be provided below the chamber and include a plurality of pins capable of being raised and lowered to support the substrate with.

The second gas may be a reactive gas including a fluoride-based gas or an oxygen-based gas.

The second electrode may have a high frequency power applied thereto, and the first electrode may be connected to ground.

The second electrode may define a plurality of discharging nozzles to discharge the second gas toward the substrate, and the second electrode may include a raising/lowering member adjusting a distance between the second electrode and the substrate supporter.

In accordance with another exemplary embodiment, a plasma treatment method includes: seating a substrate on a substrate supporter within a plasma processing apparatus and between a first electrode and a second electrode; adjusting a distance between the substrate that is inserted and the first electrode; discharging a first gas onto a first surface of the substrate that is fixed, and discharging a second gas onto a second surface of the substrate; and plasma treating the second surface of the substrate through applying power to the second electrode and forming plasma.

The distance may be between approximately 0.1 mm to approximately 0.7 mm, and the method may further include, prior to the discharging of the first and second gas, adjusting a distance between the second electrode and the first electrode or a distance between the second electrode and the substrate fixed on the substrate supporter, through moving the second electrode.

In the plasma treating of the substrate, the plasma may be formed of at least one reactive gas selected from the group consisting of $CF_4$, $CHF_4$, $SF_6$, $C_2F_6$, and $C_4F_8$, and the reactive gas may further include an oxygen-based gas.

In accordance with an exemplary embodiment, there is provided a method for plasma processing, the method including: placing a substrate on a substrate supporter of a plasma processing apparatus between a first electrode and a second electrode; while injecting a first gas into a gap between the substrate and the first electrode and a second gas in a direction from the second electrode to the substrate supporter, injecting a third gas toward a center portion of the second electrode so as to confine the second gas between the substrate supporter and the second electrode; and applying power to the second electrode to form plasma so as to treat a second surface of the substrate using the plasma.

The first gas may be a non-reactive gas including a hydrogen or inert gas, and the second gas may be a reactive gas including a fluorine or oxygen based gas. The third gas may be a reactive or non-reactive gas.

Pressures of the second and third gases in a region adjacent to the substrate may be equal to or lower than a pressure of the first gas in a region adjacent to the substrate, and a pressure of the third gas may be equal to or higher than a pressure of the second gas.

The method may further include injecting a fourth gas to the second electrode so as to prevent the second and the third gases from diffusing away from the second electrode.

In this case, the fourth gas may be injected toward the first electrode.

The method may further include injecting a fifth gas to the substrate supporter so as to prevent the second and the third gases from diffusing away from the second electrode. The fifth gas may be injected toward the second electrode.

The fourth and fifth gases may be non-reactive gases, and a pressure of the fourth gas or the fifth gas may be equal to or higher than pressures of the second and third gases.

In accordance with another exemplary embodiment, there is provided a method for plasma processing, the method including: placing a substrate on a substrate supporter of a plasma processing apparatus between a first electrode and a second electrode; injecting a first gas into a gap between the substrate and the first electrode and a third gas in a direction from a first peripheral region to a center region of the second electrode; and applying power to the second electrode to change the third gas into plasma for treating a second surface of the substrate using the plasma.

The third gas may be a reactive gas including a fluorine or oxygen based gas. The third gas may be a reactive or non-reactive gas. The method may further include injecting a non-reactive gas as a fourth gas to the second electrode from a second peripheral region located outside the first peripheral region so as to prevent the third gas from diffusing away from the second electrode.

In accordance with yet another exemplary embodiment, there is provided a method for plasma processing, the method including: placing a substrate on a substrate supporter of a plasma processing apparatus between a first electrode and a second electrode; adjusting a gap between the substrate an the first electrode; adjusting a distance between the substrate and the second electrode; while injecting a first gas toward a first surface of the substrate and a second gas toward a second surface of the substrate, injecting a third gas in an oblique direction from a peripheral region to a center region of the second electrode; and applying power to the second electrode to form plasma so as to treat the second surface of the substrate using the plasma.

The gap may range from approximately 0.1 mm to approximately 0.7 mm, and the distance may range from approximately 5 mm to approximately 40 mm.

A process pressure of the plasma processing apparatus may range from approximately 0.1 Torr to approximately 3 Torr.

The second gas may be at least one gas selected from the group consisting of fluorine base gases such as $CF_4$, $CHF_4$, $SF_6$, $C_2F_6$, $NF_3$, $F_2$, $F_2N_2$, and $C_4F_8$; chlorine based gases such as $BCl_3$ and $Cl_2$, and oxygen based gases. The first gas may be at least one gas selected from the group consisting of group 18 element bases gases and nitrogen based gases.

High-frequency power may be applied to the second electrode, and the first electrode may be connected to ground. The high-frequency power may have a frequency of approximately 13.56 n Mhz (where n denotes a natural number.

The third gas may be a reactive or non-reactive gas.

In accordance with still another exemplary embodiment, there is provided a method for plasma processing, the method including: placing a substrate in a plasma processing apparatus between a first electrode and a second electrode that are spaced apart from each other; and supplying at least one kind of gas so as to make a gap between the first electrode and the substrate as a non-discharge region and a space between the second electrode and the substrate as a discharge region.

The gap may range from approximately 0.1 mm to approximately 0.7 mm, and the distance may range from approximately 5 mm to approximately 40 mm. A process pressure of the plasma processing apparatus may range from approximately 0.1 Torr to approximately 3 Torr.

A non-reactive gas may be injected into the gap as a first gas. The first gas may be at least one gas selected from the group consisting of group 18 element bases gases and nitrogen based gases. A reactive gas may be injected into the space as a second gas. The second gas may be at least one gas selected from the group consisting of: at least one fluorine base gas selected from the group consisting of $CF_4$, $CHF_4$, $SF_6$, $C_2F_6$, $NF_3$, $F_2$, $F_2N_2$, and $C_4F_8$; at least one chlorine based gas selected from the group consisting of $BCl_3$ and $Cl_2$; oxygen based gases. The method may further include injecting a reactive or non-reactive gas so as to confine the second gas within the space.

High-frequency power having a frequency of approximately 13.56 n-MHz (where n denotes a natural number) may be applied to the second electrode, and the first electrode may be connected to ground.

Advantageous Effects

As described above, there are provided a substrate supporter and a plasma processing apparatus having the same capable of performing expeditious etching by using a smaller apparatus compared with a wet etching, reducing fabrication cost, and preventing generation of environmentally toxic waste.

There are also provided a substrate supporter and a plasma processing apparatus having the same that reduce the likelihood of arc discharges compared with conventional dry etching to increase process yield and product reliability, and ensure stable mounting of a substrate.

In addition, a plasma processing apparatus and a method for plasma processing using the same, when compared with a conventional dry etching, efficiently protects a surface of a substrate which is not required to be etched, and thereby increases yield of final products and reduces the rate of defects.

BRIEF DESCRIPTION OF THE DRAWINGS

Exemplary embodiments can be understood in more detail from the following description taken in conjunction with the accompanying drawings, in which:

FIG. 49 is a view illustrating an operation of each element at each processing stage;

FIG. 50 is a graph illustrating a dependency of etch rate and uniformity upon a change of distance (D); and FIG. 51 is a graph illustrating a dependency of etch rate and uniformity upon a processing pressure.

BEST MODE FOR CARRYING OUT THE INVENTION

Figure 1:
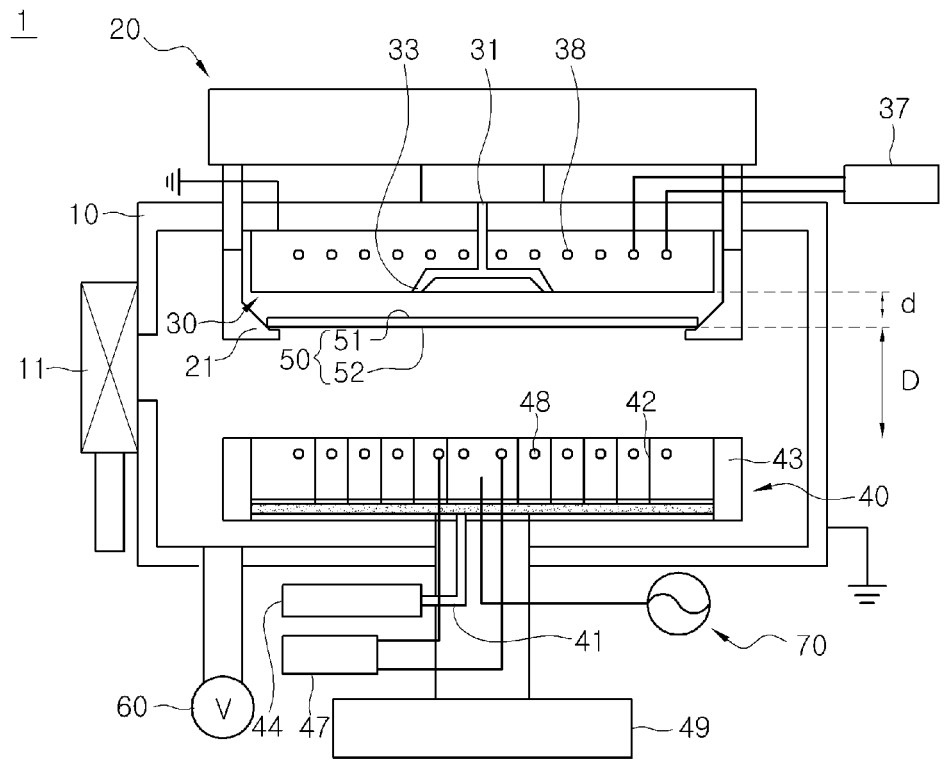
FIG. 1 is a schematic view of a plasma processing apparatus in accordance with a first exemplary embodiment.

Hereinafter, exemplary embodiments of a substrate supporter and a plasma processing apparatus will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

FIG. 1 is a schematic view of a plasma processing apparatus in accordance with a first exemplary embodiment.

Referring to FIG. 1, a plasma processing apparatus 1 in accordance with the first exemplary embodiment includes a first electrode 30, a substrate supporter 20 and a second electrode 40. A first gas is injected at the first electrode 30. The substrate supporter 20 supports a substrate 50, and a distance between the first electrode 30 and the substrate supporter 20 can be adjusted. The second electrode 40 is disposed apart from the substrate supporter 20 and a power supply 70 is applied to the second electrode 40. And a second gas is injected from the second electrode 40 to generate plasma between the second electrode 40 and the substrate 50 supported by the substrate supporter 20.

According to the exemplary embodiment, the plasma processing apparatus 1 is an etching apparatus that etches thin films and particles remaining on the rear surface 52 of the substrate 50 such as a wafer on which a device having a predetermined thin film pattern is formed.

The plasma processing apparatus 1 includes a chamber 10 that can be opened or closed by an opening/closing member 11 such as a gate valve, and a typical vacuum exhausting system 60 communicating with the chamber 10.

The chamber 10 communicates with the outside through at least one opening/closing member 11, and may be a chamber 10 applied to a system including a plurality of chambers such as a cluster system or an inline system. Also, the chamber 10 is grounded so that current will not flow through the chamber 10.

The first electrode 30 is disposed within the upper portion of the chamber 10, and the first electrode 30 may be connected to ground. Also, a discharge nozzle 33 for discharging non-reactive gas is formed in the first electrode 30, and the discharge nozzle 33 communicates with a supply nozzle 31 so that non-reactive gas is supplied from outside the chamber 10.

A plurality of discharge nozzles 33 may be formed in the first electrode 30 so that non-reactive gas which is supplied from the outside of the chamber 10 through a single supply nozzle 31 can be uniformly injected throughout the entire surface of the first electrode 30 through which the non-reactive gas is injected. The plurality of discharge nozzles 33 communicates with and is branched from the supply nozzle 31 within the first electrode 30.

In a case where the discharge nozzles 33 are formed close to or far from a single supply nozzle 31 respectively, the discharge nozzle which is formed far from the discharge nozzles 33 may have a greater diameter than the discharge nozzle which is formed close to the discharge nozzles 33. Therefore, pressure decrease resulting from the longer distance of the gas flow can be compensated when the non-reactive gas is injected.

Coolant passages 38 connected to a coolant circulating member 37 configured outside the chamber 10 are provided within the first electrode 30.

Gas supplied through the supply nozzle 31 of the first electrode 30 may be hydrogen, nitrogen or inert gas, or it may be other non-reactive gas that does not react with the front surface 51 of a substrate.

Here, the front surface 51 of the substrate may be a surface of the substrate 50 such as a wafer on which a device having a predetermined thin film pattern is formed, or may be a surface of the substrate 50 that does not need to be etched.

The substrate 50 is spaced apart by a predetermined distance from a surface of the first electrode 30 on which the discharge nozzles 33 are formed so that the front surface 51 thereof is disposed facing the discharge nozzles 33, and is supported by the substrate supporter 20.

The substrate supporter 20 is configured to support the substrate 50 with arms 21 extending from the upper portion of the chamber 10, and the arms 21 are configured to be extendable by a driving member (not shown) provided to the substrate supporter 20 outside the chamber 10.

To maintain a vacuum seal with the configuration of the substrate supporter 20 which is extendable by the driving member, a portion at which the substrate supporter 20 exposed to outside the chamber 10 and the driving member are connected may have a compressible bellows-shaped configuration.

The arms 21 of the substrate supporter 20 may support only the external perimeter of the substrate 50, and supports only a portion of the external perimeter from the bottom in order to maximize the exposed region of the rear surface 52 of the substrate.

The arms 21 are connected to the driving member to move up and down, i.e., closer or further with respect to the first electrode 30, so that the substrate 50 supported by the arms 21 is also moved closer to or further with respect to the first electrode 30.

Here, the rear surface 52 of the substrate may be the other surface of the surface of a substrate 50 such as a wafer on which a device having with a predetermined thin film pattern is formed, or may be a surface of a substrate 50 requiring etching.

Through the up and down movement of the arms 21, a predetermined variable gap (d) is maintained between the front surface 51 of the substrate 50 and the surface of the first electrode 30 from which the non-reactive gas is discharged.

Also, the substrate supporter 20 may be configured to electrically float with respect to the plasma processing apparatus 1 so that it is not electrically interfered with other structural components. Also, the substrate supporter 20 including the arms 21 may be formed of insulating material such as $Al_2O_3$ to prevent damage of the substrate supporter 20 by external electric shocks.

The second electrode 40 is disposed below the substrate supporter 20 to be spaced apart from the rear surface 52 of the substrate 50 by a predetermined distance (D).

The second electrode 40 is configured to be supplied with power 70, and includes discharge nozzles 42 from which reactive gas is injected.

The discharge nozzles 42, similar to the discharge nozzles of the first electrode 30, are configured so that the reactive gas supplied from the outside of the chamber 1 through a supply nozzle 41 communicating with the discharge nozzles 42 can be injected into the chamber 1. The discharge nozzles 42 are provided in plurality facing the rear surface 52 of the substrate so that the reactive gas is uniformly injected throughout the entire rear surface 52 of the substrate 50 supported by the substrate supporter 20.

Similar to the discharge nozzles 42 of the second electrode 40, a discharge nozzle 42 formed to be far from the supply nozzle 41 may have a greater diameter than a discharge nozzle 42 formed to be close to the supply nozzle 41, in order to compensate for pressure decrease resulting from the longer distance of the gas flow when the non-reactive gas is injected.

Besides the above configurations, the gas discharging configurations of the first electrode 30 or the second electrode 40 may be varied in various forms depending on requirements.

An insulating ring 43 is provided around the periphery of the second electrode 40 to concentrate plasma generated on the second electrode 40. The insulating ring 43 may be formed of an insulating material such as $Al_2O_3$.

Reactive gas which is discharged through the discharge nozzles 42 of the second electrode 40 may include a fluorine-based gas such as $CF_4$, $CHF_4$, $SF_6$, $C_2F_6$, and $C_4F_8$, or an oxygen-based gas, or may be a gas including other elements capable of chemically etching thin films or particles deposited on the rear surface 52 of the substrate.

The second electrode 40, like the substrate supporter 20, is configured to move up and down by means of a separate driving member 49 provided outside the chamber 1, so that a distance (D) between the rear surface 52 of the substrate 50 supported by the substrate supporter 20 and the second electrode 40 can be variable.

To maintain a vacuum seal with the second electrode 40 configured to move up and down by the driving member 49, a portion at which the second electrode 40 exposed to the outside of the chamber 10 is connected to the driving member 49 may have a compressible bellows-shaped configuration.

Also, coolant passages 48 connected to a coolant circulating member 47 configured outside the chamber 10 are provided within the second electrode 40. The coolant circulating member 47 may be the same member as the coolant circulating member 37 that circulates coolant in the first electrode 30.

The power supply 70 connected to the second electrode 40 may be a high frequency power supply having a frequency of an integer multiple of 13.56 MHz, or may be another power supply depending on the intended process, apparatus, etc. Here, the configuration of the high frequency power supply 70 connected to the second electrode 40 includes a matching device.

Due to the configuration of the grounded first electrode 30 and the second electrode 40 connected to the high frequency power supply 70, the first electrode 30 functions as an anode and the second electrode 40 functions as a cathode. An alternating oscillation of 13.56 MHz or an integer multiple of 13.56 MHz is provided between the anode and the cathode to increase plasma generating efficiency.

Figure 2:
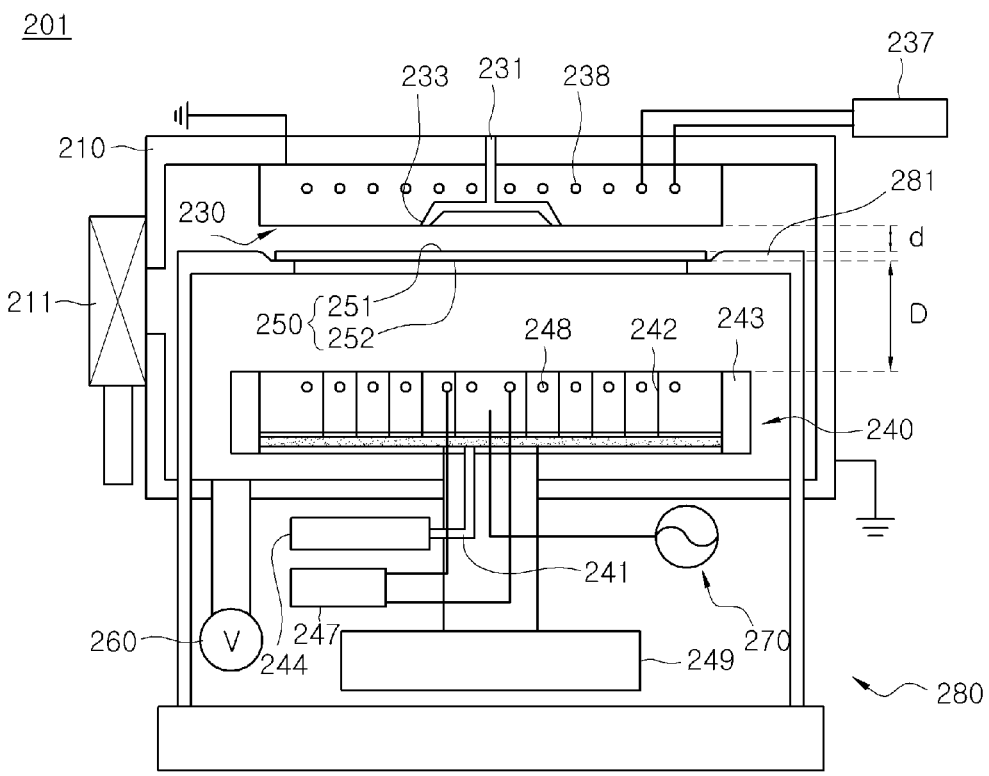
FIG. 2 is a schematic view of a plasma processing apparatus in accordance with a second exemplary embodiment.

FIG. 2 is a schematic cross sectional view of a plasma processing apparatus in accordance with a second exemplary embodiment.

Unlike the substrate supporter 20 in FIG. 1 which suspends the substrate 50 from the upper portion of the chamber 10, that is, from the first electrode 30, to support the substrate 50, the substrate supporter 280 in FIG. 2 is provided at the lower portion of the chamber 210 to support the substrate 250.

The substrate supporter 280 in FIG. 2 also includes a driving member (not shown), and contacts and supports the substrate 250 with an arm 281 moving up and down by the driving member. Through the up and down movement of the arm 281 by the driving member, a variable predetermined gap (d) is maintained between the front surface 251 of the substrate 250 and a surface of the first electrode 230 at which non-reactive gas is injected.

In a case of the substrate supporter 280 as shown in FIG. 2, like the substrate supporter 20 in FIG. 1, the arm 281 may support the outer peripheral portion of the substrate 250 to maximize the exposed area of the rear surface 252 of the substrate. Another configurations for the same purpose are also possible.

To maintain a vacuum seal with configuration in which the substrate supporter 280 moves up and down by the driving member, a portion of the substrate supporter 280 exposed to the outside the chamber 210 may have a compressible bellows-shaped configuration.

Figure 3:
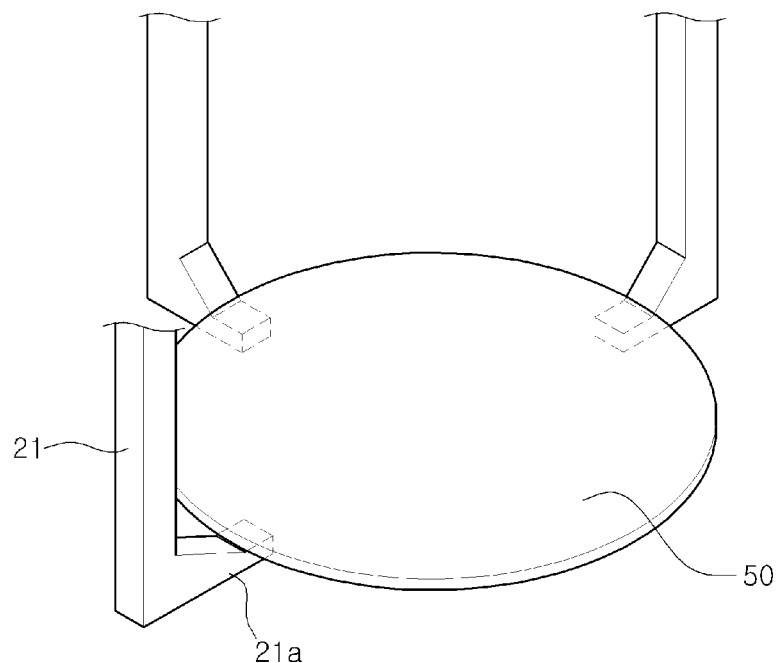
FIG. 3 is a partial perspective view of the substrate supporter in FIG. 1 and a substrate supported thereon.

FIG. 3 is a partial perspective view of the substrate supporter in FIG. 1 and a substrate supported thereon.

The arms 21 of the substrate supporter 20 are connected to the driving member (not shown) that moves and extends the arms 21 up and down, and the arms 21 are extended vertically downward.

A supporting portion is formed at the lower end of the arm 21 in a perpendicular direction with respect to the vertical downward direction of the arm 21 in which the arm 21 is extended. A supporting member 21a as an example of the supporting portion is formed to extend in an inward direction which is defined by the respective arms 21 so that the substrate 50 can be supported.

Herein, the supporting portion is included as an element of the substrate supporter 20, and refers to a member that directly contacts and supports the substrate 50.

When only one supporting member 21a is formed for each arm 21 to support the substrate 50, the exposed area of the substrate 50 can be maximized. However, two or more supporting members 21a may be formed for each arm 21.

Herein, it is desirable that the supporting members 21a support only a portion of the outer periphery of the substrate 50, and the respective supporting members 21a keep horizontal balance with respect to one another to support the substrate 50 to be horizontally balanced.

The number of arms 21 having the supporting members 21a may be at least three to support the substrate 50, and the arms 21 may be disposed to be equiangular with each other with respect to the center of the substrate 50.

In contrast to supporting the substrate 50 by lift pins in the related art, a greater region of the substrate 50 may be exposed to plasma etching by the supporting members 21a supporting portions of the perimeter of the rear surface of the substrate 50. Further, because the substrate 50 is supported at the peripheral region which is far from the central region of the substrate 50 where the plasma reaction is most active, arc discharge during the process can be prevented. Also, because arms 21 are disposed at the periphery of the mounting region of the substrate 50, the substrate 50 can be prevented from leaving the processing region and securely mounted.

Figure 4:
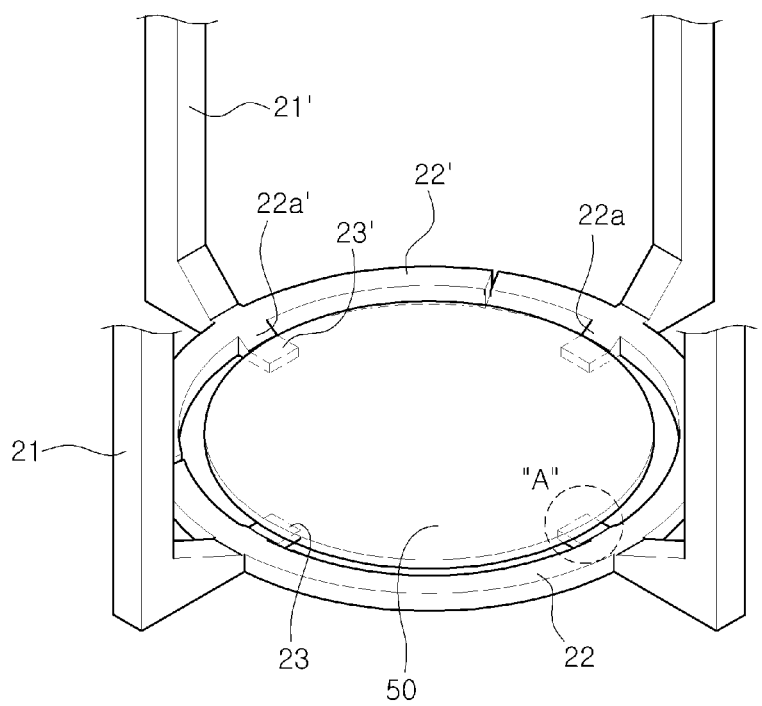
FIG. 4 is a first variant of FIG. 3.
Figure 5:
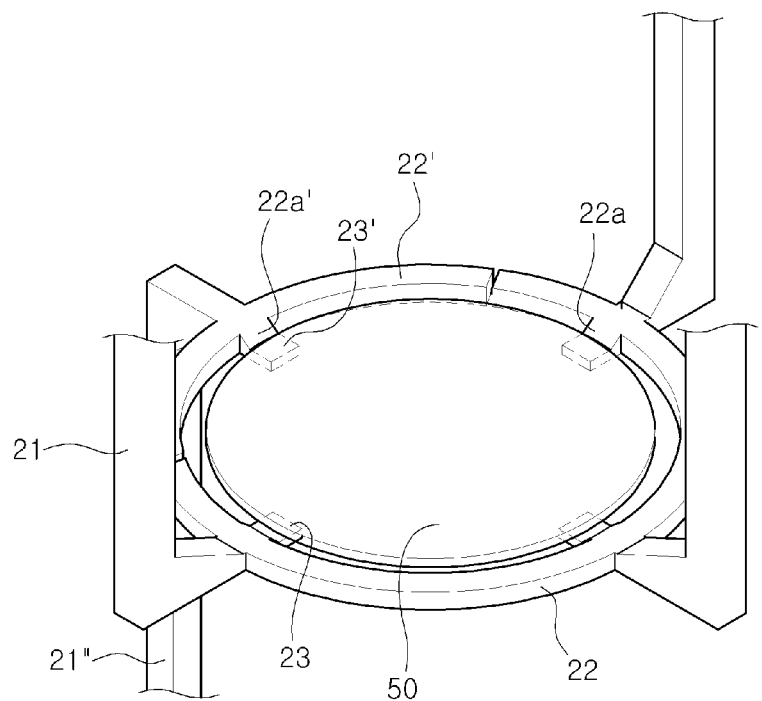
FIG. 5 is a second variant of FIG. 3

FIG. 4 is a first variant of FIG. 3, and FIG. 5 is a second variant of FIG. 3.

Referring to FIG. 4, the respective arms 21 are connected to form a supporting ring 22, and supporting pins 23 are formed at the supporting ring 22 in a mounting direction of the substrate 50.

The supporting ring 22 is formed in a shape of an open curve around the mounting portions of the substrate 50. An auxiliary arm 21' and an auxiliary ring 22' which is formed at the auxiliary arm 21' are disposed in an open portion of the supporting ring 22. The auxiliary ring 22' may also include a supporting pin 23' formed thereon. Of course, the supporting pin 23' may be omitted from the configuration of the auxiliary ring 22'.

The open portion of the supporting ring 22 formed in a shape of an open curve is provided to prevent interference with a transporting member (not shown) for the substrate 50 such as a robotic arm while the substrate 50 is seated on and removed from the substrate supporter 20. During processing, after the substrate 50 is seated, the auxiliary arm 21' is moved so that the auxiliary ring 22' and the supporting ring 22 form a substantially closed curve.

Compared to FIG. 3, the configuration of the supporting ring 22 is for improving uniformity of plasma formed around the substrate 50 when plasma is generated during etching. And the auxiliary ring 22' disposed at the open portion of the supporting ring 22 is also for improving uniformity of plasma.

Further, the supporting ring 22 is configured to help the substrate 50 be stably seated by ensuring the seating position of the substrate 50 while the substrate 50 is seated on the substrate supporter 20. The respective arms 21 are connected through the supporting ring 22 and, therefore, horizontal balance of the substrate 50 can be ensured when seated.

Accordingly, the supporting ring 22 and the auxiliary ring 22' annularly encloses the substrate 50 at the outside thereof, thus maintaining uniformity of plasma formed on the rear surface of the substrate 50.

The auxiliary arm 21" with the auxiliary ring 22' formed thereon may be formed in the opposite direction to the other arms 21, as shown in FIG. 5, and may also be driven in a different direction.

Of course, the auxiliary arm 21' and 21" may operate independently of the other arms 21 in any cases.

As in FIG. 3, the substrate 50 in FIGS. 4 and 5 is contacted and supported only at peripheral portion thereof. Therefore, the substrate 50 is in contact with arms 21 so that they are as far as possible from the plasma generation region, and occurrence of arc discharge can be minimized.

In a reactor with a configuration such as a cluster system, when mounting a substrate 50 such as a wafer on a substrate supporter 20, the substrate 50 is conveyed and seated on the substrate supporter 20 by a robotic arm, after which the robotic arm is removed in a successive movement. Here, the auxiliary arm 21' is configured to prevent interference between the robotic arm and the substrate supporter 20.

In other words, the substrate 50 is conveyed by the robotic arm through the open portion defined by the open curve of the supporting ring 22. After the substrate 50 is seated on the substrate holder 20 and the robotic arm is withdrawn, the auxiliary arm 21' is moved to the open portion of the supporting ring 22 by a driving member, so that the supporting ring 22 and the auxiliary ring 22' can form a closed curve.

The auxiliary ring 22' may have the same curvature as that of the supporting ring 22, and more preferably, the supporting ring 22 and the auxiliary ring 22' may have concentric curvatures. However, this is suitable for wafers 50 that are substantially circular, and the rings may have another shape according to a shape of a substrate 50.

The auxiliary ring 22' may be contacted and coupled to the supporting ring 22 using typical coupling methods, such as interlocking coupling, magnetic coupling, and male-female coupling.

The substrate 50 can be more stably seated by the alignment of the auxiliary ring 22', floating of the substrate 50 from the substrate supporter 20 can be prevented even if vibrations and the like may occur.

Components of the substrate supporter 20 such as the supporting ring 22 and the auxiliary ring 22' may be formed of hard solid such as metal, ceramic and so forth.

Of course, configuration of the auxiliary ring 22' structure may be omitted according to the type of substrate 50, apparatus 1, required processes and so forth.

Figure 6:
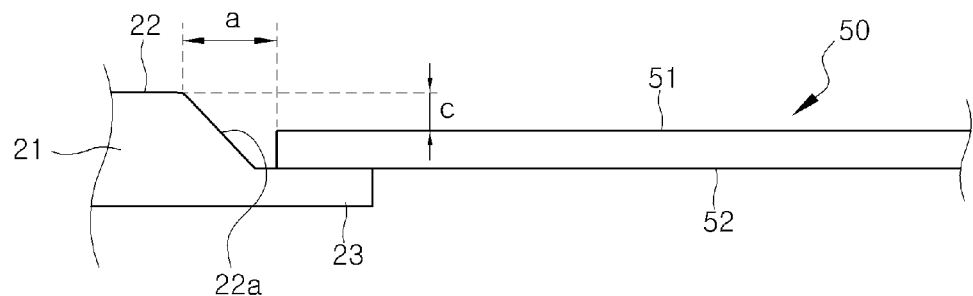
FIG. 6 is an enlarged sectional view of region "A" in FIG. 4.

FIG. 6 is an enlarged sectional view of region "A" in FIG. 4.

A supporting pin 23 is formed on the supporting ring 22 of the arm 21, and the supporting pin 23 contacts and supports the substrate 50, and more specifically, a portion of the outer perimeter of the rear surface 52 of the substrate.

In this case, the supporting pin 23 is configured to support at least 3 or more points of the substrate 50, and for this, 3 or more arms 21 are provided. Here, the three or more arms 21 may be arranged to be equiangular to each other with respect to the center of the substrate 50.

Figure 7:
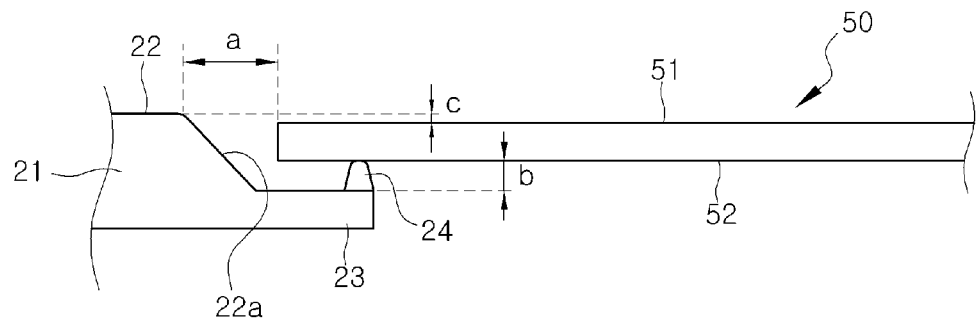
FIG. 7 is another example of FIG. 6.

FIG. 7 is another example of FIG. 6.

Referring to FIG. 7, the arm 21 of the substrate supporter 20 includes a supporting ring 22 having a predetermined stepped surface formed with a slope 22a, the supporting pin 23 extends from the supporting ring 22, and the supporting pin 23 has a protrusion 24 protruding toward the lower portion of the substrate 50, that is, the rear surface 52 of the substrate. The protrusion 24 directly contacts the rear surface 52 of the substrate, and may be formed in a pointed shape to minimize the contacting area with the rear surface 52 of the substrate.

The supporting pins 23 of the substrate supporter 20 are configured to support the substrate 50 at 3 or more points, and one supporting pin 23 has one or more protrusions 24, so that the rear surface 52 of the substrate and the second electrode 40 (in FIG. 2) do not interfere with each other, that is, exposure of the rear surface 52 of the substrate toward the second electrode 40 can be maximized.

The supporting pin 23 having one protrusion 24 may be provided in a minimum number to allow maximum exposure of the rear surface 52 toward the second electrode 40, and may be formed to support the substrate at two or three points. However, when the substrate 50 is supported at two points, it is difficult to keep a horizontal balance. Therefore, the supporting pins may be configured to support three or more points.

The points of the substrate 50 supported by the supporting pins 23 having the protrusions 24 may be arranged equiangular to each other.

The supporting pin 23 extending from the supporting ring 22 and the protrusion 24 provided on the supporting pin 23, have a gap (a) between the substrate 50 side on the supporting ring 22, that is, a starting point of the slope 22a, and the outer edge of the substrate 50, a gap (b) between the supporting pin 23 and the rear surface 52 of the substrate, and a vertical height (c) from the top of the supporting ring 22 to the front surface 51 of the substrate. Comparing the configurations of FIGS. 6 and 7, the gap (b) between the supporting pin 23 and the rear surface 52 of the substrate is 0 in FIG. 6 due to the absence of the protrusion 24.

The supporting ring 22 is formed to have a slope 22a of a predetermined angle from the top thereof to the starting end of the supporting pin 23, and the gap (a) is formed between the supporting ring 22 and the outer edge of the substrate 50. The supporting ring guides the flow of a first gas which is injected toward the front surface 51 toward the rear surface 52 of the substrate.

If the gap (a) between the supporting ring 22 and the outer edge of the substrate 50 is too narrow, gas cannot flow easily and physical interference between the substrate supporter 20 and the substrate 50 can be caused when the substrate 50 is seated on the substrate supporter 20. Therefore, the gap (a) may be 3 mm or more.

The supporting pin 23 is formed to extend from the supporting ring 22 toward the substrate 50, and is integrally formed with the supporting ring 22.

The substrate pin 23 may be formed to extend approximately 1 mm from the bottom of the slope 22a of the supporting ring 22. If the supporting pin 23 is too short, it is difficult to securely support the substrate 50, and if the supporting pin 23 is too long, it will interfere excessively between the rear surface 52 of the substrate and the second electrode 40 to reduce the efficiency of the apparatus and the processes performed in the apparatus. Therefore, an appropriate length of the supporting pin 23 is 1 mm to 3 mm.

The gap (b) between the supporting pin 23 and the rear surface 52 may be defined by the protrusion 24 provided at the end of the supporting pin 23 toward the first electrode 30, that is, toward an upward direction. Also, when the thickness of a substrate 50 used is uniform like a wafer, the vertical height (c) from the top of the supporting ring 22 to the front surface 51 of the substrate may be dependent on the size of the protrusion 24.

The protrusion 24 is formed to support the rear surface 52 of the substrate from the supporting pin 23, and to be as sharp as possible to maximize exposure of the rear surface 52. The protrusion 24 is formed to have a height of 0.5 mm to 1 mm from the supporting pin 23. The gap (b) between the supporting pin 23 and the rear surface 52 of the substrate is formed to be 0.5 mm to 1 mm by the height of the protrusion 24.

When the protrusion 24 is less than 0.5 mm, the flow of gas, especially the flow of a second gas, can be inhibited by the narrow gap (b) between the substrate 50 and the supporting pin 23. When the protrusion 24 exceeds 1 mm, the protrusion 24 can be damaged due to the sharp configuration of the protrusion 24.

The vertical height (c) from the top of the supporting ring 22 to the front surface 51 of the substrate may be dependant on the height of the protrusion 24 and the thickness of the substrate 50. Although it is not particularly restricted, the vertical height (c) may be 0, that is, the top of the supporting ring 22 and the front surface 51 of the substrate have the same height, or may be a negative value, that is, the front surface 51 of the surface is lower than the top of the supporting ring 22.

If the front surface 51 of the substrate is higher than the top of the supporting ring 22, the substrate 50 may possibly leave the seating position of the substrate supporter 20 by external vibrations, and this configuration is not appropriate for gas flow. Therefore, the height of the front surface 51 may be equal to or lower than the top of the supporting ring 22.

As such, due to the structure of the substrate supporter 20 which minimizes contact with the substrate 50 and supports the substrate 50 at a position far from the center of the processing area, arc discharge during processing can be prevented to enhance secure processing and inhibit damage of substrates.

It is apparent that the above-configured substrate supporter 20 is applicable to the substrate supporter 280 in FIG. 2 or the substrate supporter 20 in FIG. 1.

The auxiliary ring 22' in FIGS. 4 and 5 may be configured like the supporting pin 23 or the protrusion 24 in FIG. 6 or 7.

Figure 8:
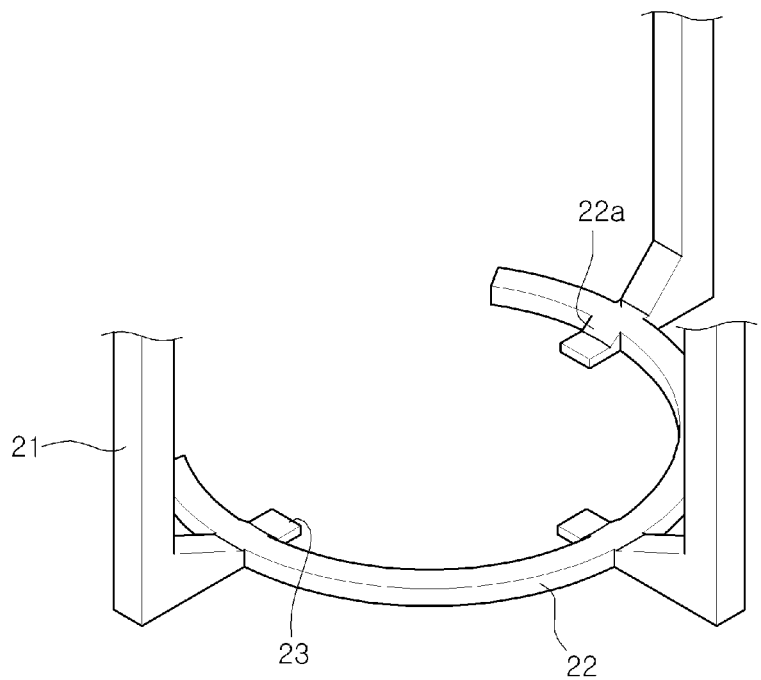
FIGS. 8 through 10 are perspective views sequentially illustrating an operation of the substrate supporter in accordance with the first exemplary embodiment.
Figure 9:
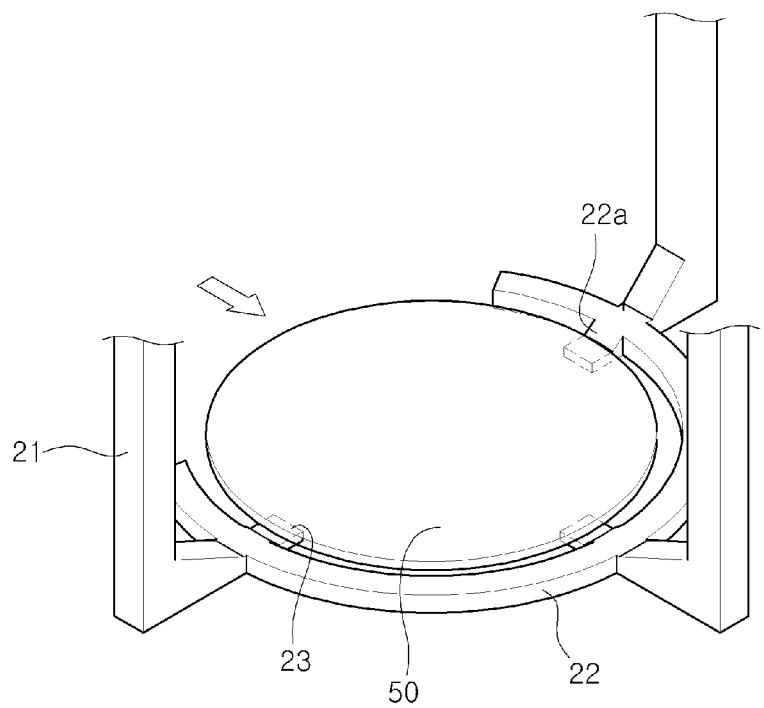
Figure 10:
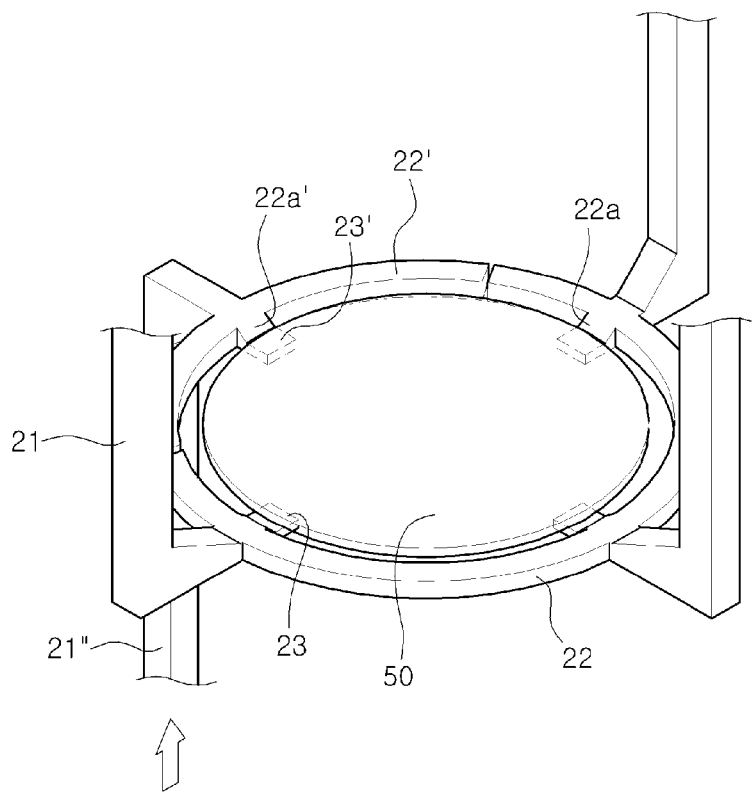

FIGS. 8 through 10 are perspective views sequentially illustrating an operation of a substrate supporter in accordance with the first exemplary embodiment. Although the substrate supporter in accordance with the first exemplary embodiment is the substrate supporter 20 having a configuration of FIG. 5, operation of other substrate supporters having a configuration that is different from the first exemplary embodiment can be the same.

According to the substrate supporter 20 illustrated in FIG. 8, an arm 21 is moved to a preset position and is fixed.

Referring to FIG. 9, a substrate 50 is conveyed onto the substrate holder 20 through a separate conveying member (not shown), and the substrate 50 is seated on a supporting pin 23. Here, the supporting pin 23 may be a supporting pin 23 having a configuration shown in FIG. 6, or may be a supporting pin 23 having a protrusion 24 as shown in FIG. 7.

Here, the substrate 50 is conveyed through the open portion in the direction of an arrow to prevent interference between the conveying member and the substrate supporter 20. The conveying member is removed in a direction opposite to the arrow after the substrate 50 is seated.

After the conveying member is removed from the substrate supporter 20, the auxiliary arm 21" is elevated from lower portion of the substrate supporter 20 up to the open portion defined by the supporting ring 22 as shown in FIG. 10, so that the supporting ring 22 and the auxiliary ring 22' form a substantially closed portion. Here, the supporting pins 23 and 23' may be horizontally balanced with each other.

Through the operation of the substrate supporter 20, the substrate 50 is seated on the substrate supporter 20.

The operation of the plasma processing apparatus 201 having the above substrate supporter 280 will be described hereafter referring to FIGS. 11 through 14. Although a substrate supporter 280 as shown in FIG. 2 will be described as an example referring to FIGS. 11 through 14, it should be noted that other substrate supporters that are different from the substrate supporters described in the second exemplary embodiment will be operated similarly.

Figure 12:
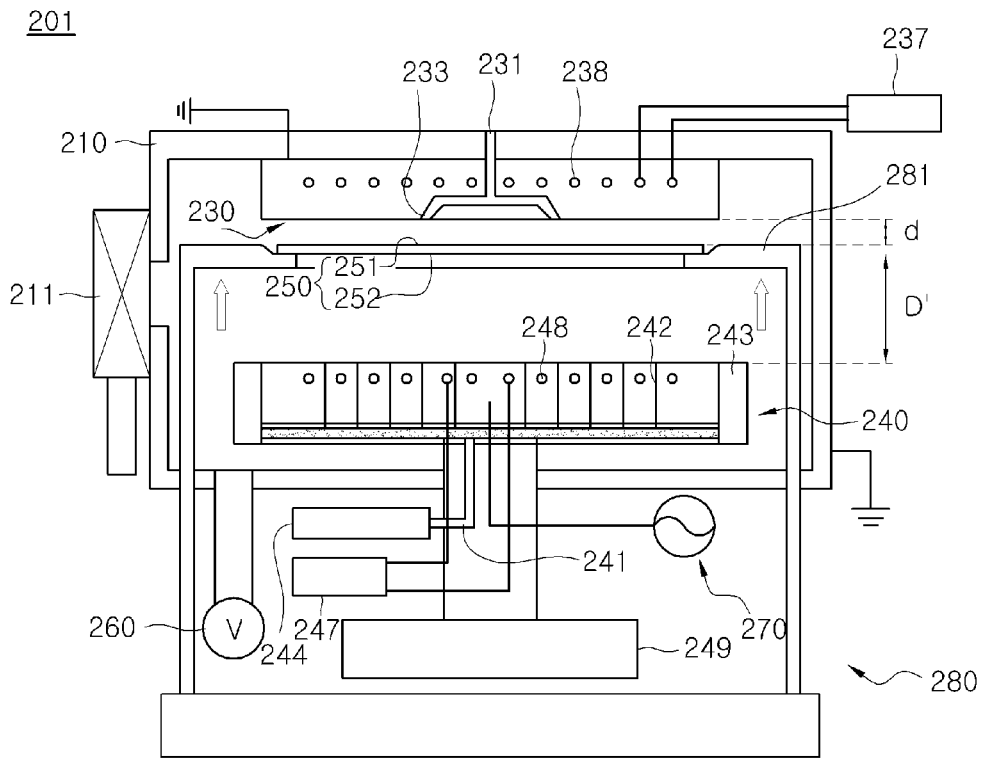
Figure 13:
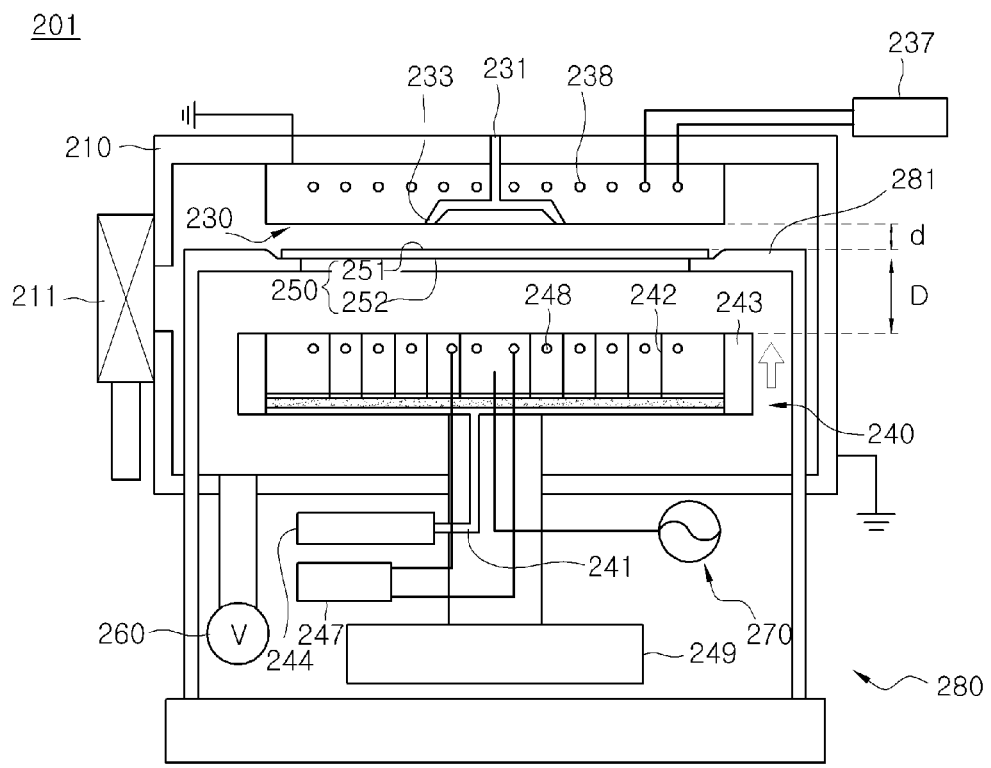
Figure 14:
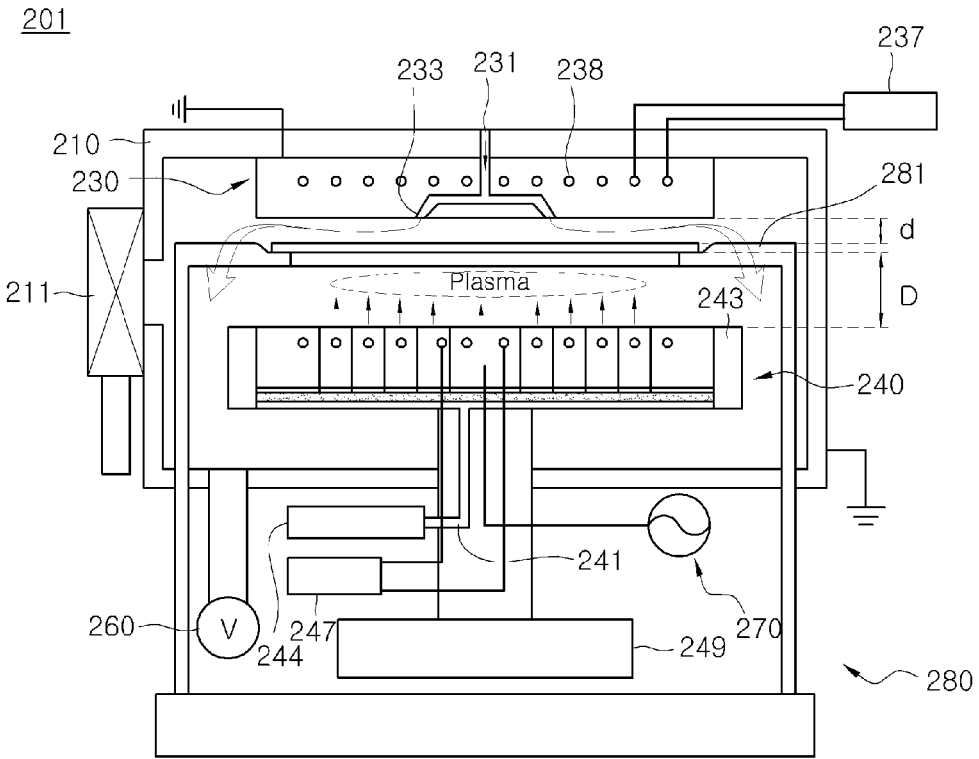

FIGS. 11 through 14 are views illustrating a plasma processing method in accordance with the second exemplary embodiment of the present invention, and in particular, the flow of gas is indicated by arrows in FIG. 14.

The plasma processing method used in the plasma processing apparatus according to the second exemplary embodiment of the present invention is a method of generating plasma to etch thin films and particles accumulated on a rear surface of a substrate 250 such as a wafer formed with a device having a predetermined thin film pattern.

The plasma processing method used in the second exemplary embodiment of the present invention includes seating a substrate 250 on a substrate supporter 280 between a first electrode 230 and a second electrode 240 within the plasma processing apparatus 201, fixing the seated substrate 250, injecting a first gas onto a first surface 251 and injecting a second gas onto a second surface 252 of the fixed substrate 250, and processing the second surface 252 of the substrate 250 by supplying power 270 to the injected second gas and generating plasma.

Figure 11:
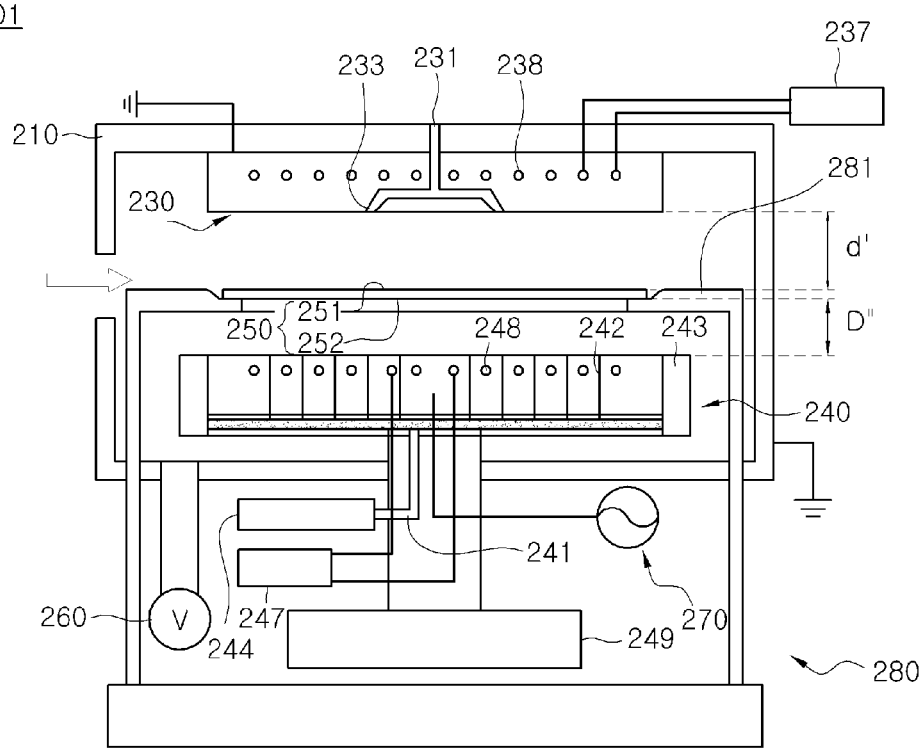
FIGS. 11 through 14 are views illustrating the operation of the plasma processing apparatus in accordance with the second exemplary embodiment.

As shown in FIG. 11, the substrate 250 is inserted through a separately provided entrance of the chamber 210, and is seated on the substrate supporter 280. The substrate 250 is supported on the substrate supporter 280 so that the front surface 251 faces discharging nozzles 233 of the first electrode 230 and the rear surface 252 faces discharging nozzles 242 of the second electrode.

Here, the substrate supporter 280 may be the substrate supporter 20 described with reference to FIG. 1.

In any cases, the substrate supporter 280 is disposed to be retreated from the first electrode 230 by a gap (d'), and the second electrode 240 is disposed to be retreated from the rear surface 252 of the substrate by a distance (D").

Next, as described with reference to FIGS. 8 through 10, the substrate 250 is seated on the substrate supporter 280.

Referring to FIG. 12, an opening/closing member 211 seals the chamber 210 to form a vacuum, and the substrate supporter 280 is elevated by a driving member (not shown) so that the front surface 251 and the first electrode 230 are spaced apart from each other by a gap (d), where (d<d'). The substrate supporter 280 is elevated to reduce the gap (d) between the first electrode 230 and the front surface 251 of the substrate and, therefore, the distance between the second electrode 240 and the rear surface 252 of the substrate is increased from a distance (D") to a distance (D').

Thereafter, as shown in FIG. 13, the second electrode 240 is also elevated by a driving member 249 so that the rear surface 252 and the second electrode 240 are separated with each other by a distance (D), (D<D').

The gap (d) between the first electrode 230 and the substrate 250 or the distance (D) between the substrate 250 and the second electrode 240, as described herein, are not achieved only through the up and down movement of the substrate supporter 280 and the second electrode 240, but may be achieved through operating of at least one component of the first electrode 230, the substrate supporter 280, and the second electrode 240. For this end, each component may have a separate driving member.

Further, the distance (D) between the second electrode 240 and the rear surface 252 of the substrate is not necessarily required to be variable. The distance (D) may be any distance (D, D' or D") as long as it is suitable for generating plasma within the distance. Accordingly, the process may be performed after moving the substrate supporter 280 without moving the second electrode 240.

Of course, distances other than the distances (D, D' and D") may be employed, and the distance between the substrate supporter 280 and the second electrode 240 may be varied depending on required processes, the size of the chamber or substrate, etc. Of course, the distance may be varied even during the process.

Thereafter, as illustrated in FIG. 14, non-reactive gas is first introduced through the first electrode 230, and then reactive gas is introduced through the second electrode 240, and power is applied through the high frequency power supply 270 to generate reactive gas plasma.

The plasma of the reactive gas is formed in a plasma generating region, and radicals in the plasma react with thin films or particles accumulated on the rear surface 252 of the substrate to remove them from the rear surface 252 of the substrate during an etching process.

Here, the plasma is generated within the distance (D) between the rear surface 252 of the substrate and the second electrode 240. Within the gap (d) between the first electrode 230 and the front surface 251 of the substrate, gas flows in a non-plasma state due to an inflow of the non-reactive gas.

Here, the gap (d) may be in a range of approximately 0.1 mm to 0.7 mm. If the gap (d) is less than 0.1 mm, the substrate may possibly get in contact with the first electrode 230. Therefore, to perform the process more stably, the gap (d) needs to be maintained greater than 0.1 mm. If the gap (d) exceeds 0.7 mm, the pressure of the non-reactive gas is relatively decreased, so that the radicals formed in the distance (D) may possibly get into the gap (d) and the front surface 251 of the substrate can be etched. Therefore, the gap (d) may be 0.7 mm or less. Further, if the gap exceeds 0.7 mm, non-reactive gas may be converted to plasma, and the front surface 251 of the substrate may be etched. However, when the gap (d) is 0.7 mm or less, it can be maintained as a region in which plasma is not generated when operated under pressures and voltages used in typical etching process.

The non-reactive gas injected from the first electrode 230 may have a higher insulation breakdown voltage than the reactive gas injected from the second electrode 240, so that it will not generate plasma due to the power applied to the second electrode 240.

The reactive gas injected from the second electrode 240 may be a highly reactive Group 7 element gas, for example, a fluorine-based gas such as $CF_4$, $CHF_4$, $SF_6$, $C_2F_6$, and $C_4F_8$, or a gas including oxygen. The reactive gas may be a gas including other types of elements capable of etching the thin films or particles depending on the type of thin films or particles accumulated on the rear surface 252 of the substrate in use.

By forming plasma with the above reactive gas, highly active radicals of the above elements are generated and react with elements that are subject to etching on the rear surface 252 of the substrate to perform etching.

To restrict the plasma region, a separate magnetic field for restriction may be further formed using permanent magnets, electromagnets, or induced magnetic fields. Sometimes, plasma generating efficiency may be further improved by inducing oscillation of ions within the plasma through magnetic force. In this case, the magnetic fields generated may be differently formed according to the configuration of the chamber 210, substrate 250, first electrode 230, second electrode 240 and so forth.

The power supply 270 that applies power to the second electrode 240 may use a direct current, alternating current or the like instead of a high frequency power supply. A unipolar or bipolar pulse current may be used as the power supply. In this case, the electrical connection of the first electrode 230 or the second electrode 240 may be varied according to the power supply used, and a separate member for supplying power may be further provided.

When etching is completed, the supply of power is turned off, the supply of reactive gas and non-reactive gas is blocked, and etch byproducts are removed from the chamber 210 through vacuum exhausting. Here, the etch byproducts is in a gaseous state reacting with radicals of the plasma and, therefore, can be fully removed through vacuum exhausting.

When removal of etch byproducts is completed, the second electrode 240 is lowered by the driving member 249, and the substrate 250 is retreated from the first electrode 230 by means of the driving member of the substrate supporter 220.

Thereafter, the vacuum is broken, the opening/closing member 211 is opened, and the substrate 250 is unloaded, whereby the etching process is completed.

Figure 15:
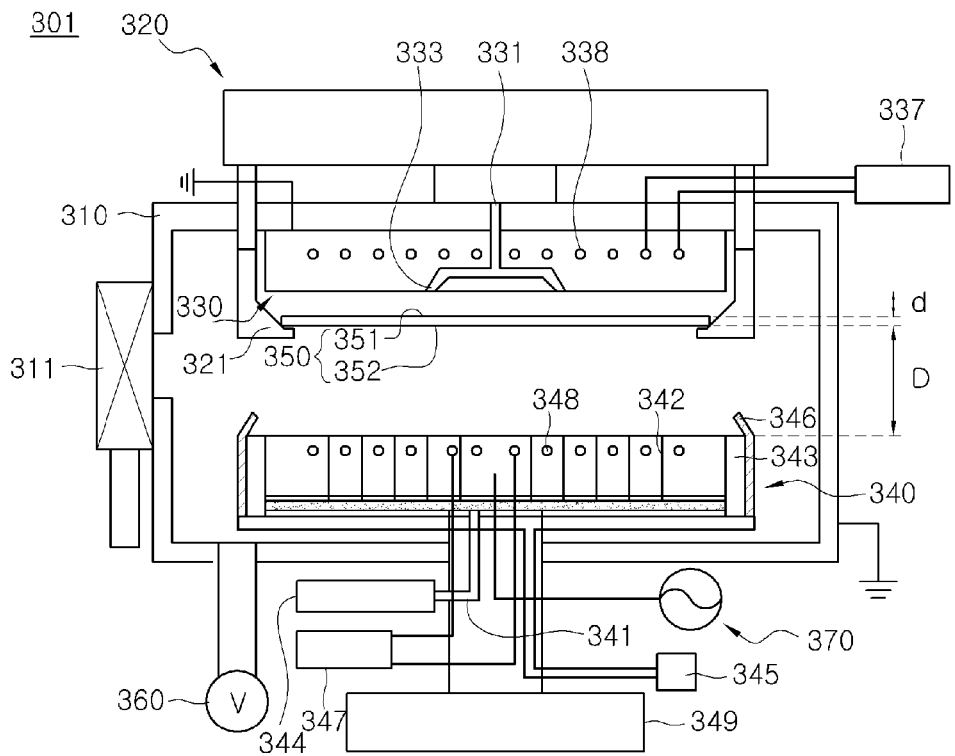
FIG. 15 is a schematic view of a plasma processing apparatus in accordance with a third exemplary embodiment.

FIG. 15 is a schematic view of a plasma processing apparatus in accordance with a third exemplary embodiment.

Referring to FIG. 15, a plasma processing apparatus 301 in accordance with the third exemplary embodiment includes a first electrode 330 at which a first gas is injected, a substrate supporter 320 which is spaced apart from the first electrode 330 so that the distance therebetween is adjustable and supports a substrate 350, and a second electrode 340 which is spaced apart from the substrate supporter 320 and generates plasma between the second electrode 340 and the substrate 350 supported by the substrate supporter 320, wherein power 370 is applied to the second electrode 340, and a second gas is injected from the second electrode 340.

According to the third exemplary embodiment, the plasma processing apparatus 301 is an etching apparatus that etches thin films and particles remaining on the rear surface of the substrate 350 such as a wafer on which a device having a predetermined thin film pattern is formed.

The plasma processing apparatus 301 includes a chamber 310 that can be opened or closed, and a typical vacuum exhausting system 360 communicating with the chamber 310.

The first electrode 330 is disposed within the upper portion of the chamber 310, and the first electrode 330 may be connected to ground. Also, a discharge nozzle 333 for discharging non-reactive gas is formed in the first electrode 330, and the discharge nozzle 333 communicates with a supply nozzle 331 so that non-reactive gas is supplied from outside the chamber 310.

A plurality of discharge nozzles 333 may be formed as a showerhead type in the first electrode 330 so that non-reactive gas which is supplied from the outside of the chamber 310 through a single supply nozzle 331 can be uniformly injected throughout the entire surface of the first electrode 330 through which the non-reactive gas is injected. The plurality of discharge nozzles 333 communicates with and is branched from the supply nozzle 331 within the first electrode 330.

The discharge nozzle which is formed far from the supply nozzle 331 of the first electrode 330 may have a greater diameter than the discharge nozzle which is formed close to the supply nozzle 331. Therefore, pressure decrease resulting from the longer distance of the gas flow can be compensated when the non-reactive gas is injected.

Gas supplied through the supply nozzle 331 of the first electrode 330 may be hydrogen or inert gas, or it may be other non-reactive gas that does not react with the front surface 351 of a substrate.

Here, the front surface 351 of the substrate may be a surface of the substrate 350 such as a wafer on which a device having a predetermined thin film pattern is formed, or may be a surface of the substrate 350 that does not need to be etched.

The substrate 350 is spaced apart by a predetermined distance from a surface of the first electrode 330 on which the discharge nozzles 333 are formed so that the front surface 351 thereof is disposed facing the discharge nozzles 333, and is supported by the substrate supporter 320.

The substrate supporter 320 is configured to support the substrate 350 with arms 321 extending from the upper portion of the chamber 310, and the arms 321 are configured to be extendable by a driving member (not shown) provided to the substrate supporter 320 outside the chamber 310.

To maintain a vacuum seal with the configuration of the substrate supporter 320 which is extendable by the driving member, a portion at which the substrate supporter 320 exposed to outside the chamber 310 and the driving member are connected may have a compressible bellows-shaped configuration.

The arms 321 of the substrate supporter 320 are configured to support only the external perimeter of the substrate 350, more particularly, to support the external perimeter of the rear surface 352 of the substrate from the bottom. The arms 321 are connected to the driving member to move up and down, i.e., closer or further with respect to the first electrode 330, so that the substrate 350 supported by the arms 321 is also moved closer to or further with respect to the first electrode 330.

Although there is a risk of contact between the lift pins and the electrodes in a conventional lift pin type supporter, the substrate supporter 320 used herein is free from the risk of contact between the electrode and substrate supporting member and, so that possibility of arc discharge can be reduced.

Here, the rear surface 352 of the substrate may be the other surface of the surface of a substrate 350 such as a wafer on which a device having with a predetermined thin film pattern is formed, or may be a surface of a substrate 350 requiring etching.

Through the up and down movement of the arms 321, a predetermined variable gap (d) is maintained between the front surface 351 of the substrate 350 and the surface of the first electrode 330 from which the non-reactive gas is discharged.

Also, the substrate supporter 320 may be configured to electrically float with respect to the plasma processing apparatus 301 so that it is not electrically interfered with other structural components. Also, the substrate supporter 320 including the arms 321 may be formed of insulating material such as $Al_2O_3$ to prevent damage of the substrate supporter 320 by external electric shocks.

The second electrode 340 is disposed below the substrate supporter 320 to be spaced apart from the substrate supporter 320 by a predetermined distance (D).

The second electrode 340 is configured to be supplied with power 370, and includes discharge nozzles 342 and a discharging member 346 from which reactive gas is injected.

The discharge nozzles 342, similar to the discharge nozzles of the first electrode 330, are configured as a showerhead type so that the reactive gas supplied from the outside of the chamber 310 through a supply nozzle 341 communicating with a supply means 344 can be injected into the chamber 310. The discharge nozzles 342 are provided in plurality facing the rear surface 352 of the substrate so that the reactive gas is uniformly injected throughout the entire rear surface 352 of the substrate 350 supported by the substrate supporter 320.

With respect to the discharge nozzles 342 of the second electrode 340, a discharge nozzle 342 formed to be far from the supply nozzle 341 may have a greater diameter than a discharge nozzle 342 formed to be close to the supply nozzle 341, in order to compensate for pressure decrease resulting from the longer distance of the gas flow when the non-reactive gas is injected.

Besides the above configurations, the gas discharging configurations of the first electrode 330 or the second electrode 340 may be varied in various forms depending on requirements.

An insulating ring 343 is provided around the periphery of the second electrode 340 to concentrate plasma generated on the second electrode 340. The insulating ring 343 may be formed of an insulating material such as $Al_2O_3$.

The discharging member 346 is formed as a nozzle type so that reactive gas supplied from a separate supplying member 345 can be injected toward the central axis of the second electrode 340 or toward the center of the substrate 350 from the outer periphery of the second electrode 340.

The gas pressure at the discharging member 346 may be equal to or greater than the gas pressure at the discharging nozzles 342 to prevent the reactive gas which is injected from the discharging nozzles 342 from diffusing over the outer perimeter of an area of the second electrode 340, that is, to restrict the discharge of the reactive gas only inside the area of the second electrode in order to increase plasma generation efficiency.

Reactive gas which is discharged through the discharge nozzles 342 of the second electrode 340 and discharging member 346 may include a fluorine-based gas such as $CF_4$, $CHF_4$, $SF_6$, $C_2F_6$, and $C_4F_8$, or an oxygen-based gas, or may be a gas including other elements capable of chemically etching thin films or particles deposited on the rear surface 352 of the substrate.

In addition, nonreactive gas such as inert gas may be injected from the discharging member 346. Either reactive gas or nonreactive gas will be injected from the discharging member 346 depending on the process requirements, and the injection pressure from the discharging member 346 may vary accordingly.

When reactive gas is injected from the discharging member 346, plasma generation efficiency at the exposed rear surface 352 of the substrate may be enhanced. Meanwhile, when nonreactive gas is injected, confining efficiency of the reactive gas injected from the discharging nozzles 342 may be enhanced.

When reactive gas is injected from the discharging member 346, it is possible to use only the reactive gas injected from the discharging member 346 and not to inject gas from the discharging nozzle 342.

When the injection pressure of the reactive gas is excessive, it may cause shaking of the substrate 350 at the rear surface 352 thereof. Therefore, the pressure of the reactive gas injected through the discharging nozzles 342 and the discharging member 346 may be adjusted to be less than or equal to the pressure of nonreactive gas injected through the discharging nozzles 333 of the first electrode 330 in the vicinity of the substrate 350.

Also, the second electrode 340, like the substrate supporter 320, is configured to move up and down by means of a separate driving member 349 outside the chamber 310, so that a distance (D) from the rear surface 352 of the substrate 350 supported by the substrate supporter 320 to the second electrode 340 is made variable.

To maintain a vacuum seal with the second electrode 340 configured to be upwardly/downwardly movable through the driving member 349, the portions at which the second electrode 340 exposed outside the chamber 310 are connected to the driving member 349 may be configured as compressible bellows.

The power supply 370 connected to the second electrode 340 may be a high frequency power supply having a frequency of an integer multiple of 13.56 MHz, or may be another power supply depending on the intended process, apparatus, etc. Here, the configuration of the high frequency power supply 370 connected to the second electrode 340 includes a matching device.

Due to the configuration of the grounded first electrode 330 and the second electrode 340 connected to the high frequency power supply 370, the first electrode 330 functions as an anode and the second electrode 340 functions as a cathode. An alternating oscillation of 13.56 MHz or an integer multiple of 13.56 MHz is provided between the anode and the cathode to increase plasma generating efficiency.

Figure 16:
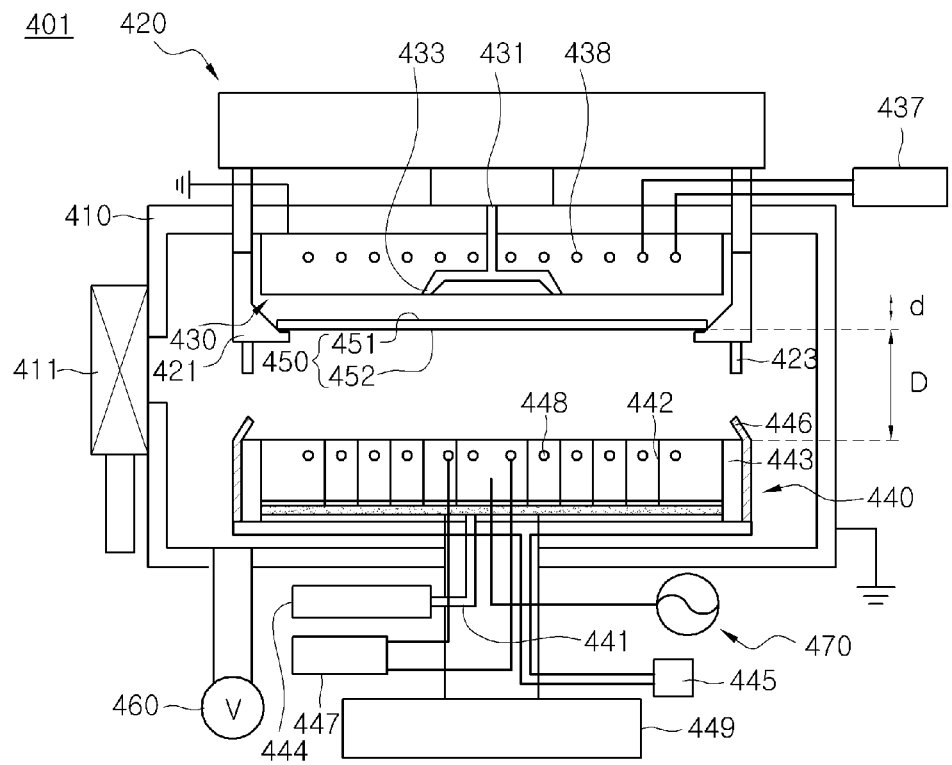
FIG. 16 is a schematic view of a plasma processing apparatus in accordance with a third exemplary embodiment.

FIG. 16 is a schematic cross sectional view illustrating a plasma processing apparatus in accordance with a fourth exemplary embodiment of the present invention.

In FIG. 16, a separate discharging member 423 is provided on the arm 421 of the substrate supporter 420 compared to FIG. 15. The discharging member 423, like the discharging member 446 of the second electrode 440, is configured to inject reactive gas or nonreactive gas to prevent the reactive gas which is injected from the discharging nozzles 442 from diffusing over the outer perimeter of an area of the second electrode 440, that is, to restrict the discharge of the reactive gas only inside the area of the second electrode 440 in order to increase plasma generation efficiency.

The discharging member 423 may be disposed in an outer region or an inner region of the discharging member 446 of the second electrode 440 in a plan view. However, in both cases, the discharging member 423 may be disposed in an outer region of the discharging nozzles 442.

Also, the discharging member 423, like the discharging member 446 of the second electrode 440, may be disposed toward the center of the substrate 450, and may be disposed facing vertically downward direction.

FIGS. 17 through 22 are enlarged views illustrating various variants of the discharging member 346 of the second electrode 340 in the third exemplary embodiment.

Figure 17:
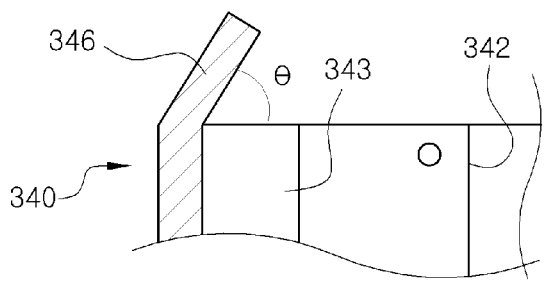
FIGS. 17 through 22 are enlarged views illustrating exemplary embodiments of the discharging member in FIG. 15.

First, referring to FIG. 17, the discharging member 346 of the second electrode 340 is formed to extend over the upper portion of the second electrode 340 by a predetermined length and face toward inside of the second electrode 340, that is, toward the central axis of the second electrode 340. The discharging member 346 prevents reactive gas which is injected from the discharging nozzles 342 of the second electrode toward the substrate 350 from flowing over the outer periphery of the second electrode 340.

An angle (θ) between the discharging member 346 and the body of the second electrode 340 is not particularly limited, and may be varied depending on a size of the chamber 310, a size of the second electrode 340, or a distance (D) between the second electrode 340 and the substrate 350.

A separate driving member (not shown) may be provided to change the angle (θ) between the discharging member 346 and the body of the second electrode 340.

Figure 18:
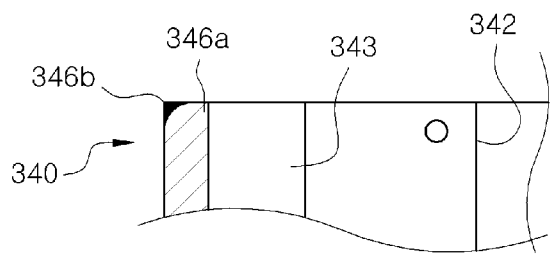

Also, the discharging member 346 may not be formed as a separate nozzle but may be integrally formed with the body of the second electrode 340. The discharging member 346 may have a slope of the angle (θ) with respect to the upper surface of the second electrode 340. More preferably, as shown in FIG. 18, the discharging member 346 may have a slope with a predetermined curvature so that gas can flow in the injected direction in a region of the main body of the second electrode 340.

That is, the gas injected along a blocking portion 346b can be injected toward the center of the second electrode 340, in which the blocking portion 346b has a curvature and blocks a portion of the discharging member 346a.

Figure 19:
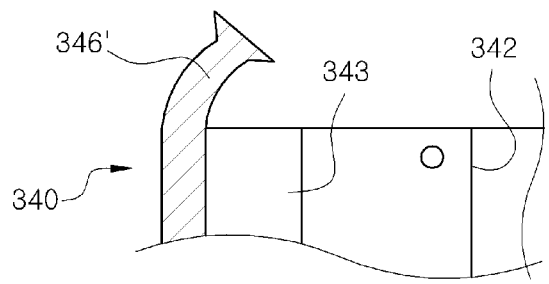

For the same purpose, a discharging member 346' may be formed to have a flared gas injection tip as in FIG. 19, so that gas injected from the discharging member 346' can diffuse to a wide region in the distance (D).

Figure 20:
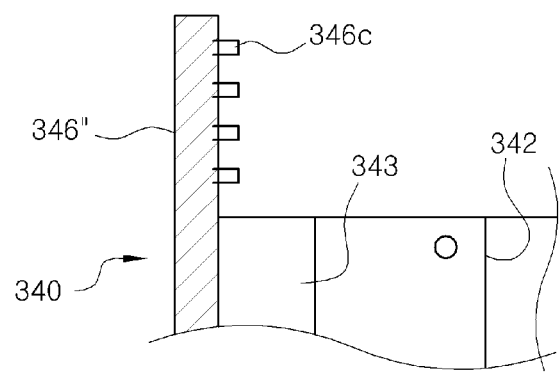

In another example shown in FIG. 20, a plurality of discharging members 346c is formed to extend toward the center of the second electrode 340 on a discharging assembly 346" which is formed to extend in the same direction as the discharging nozzles 342 of the second electrode 340, so that gas can be injected therethrough.

In any cases, gas injected from the discharging members 346c may be either reactive gas or nonreactive gas, and concentrating efficiency of plasma of the reactive gas formed between the second electrode 340 and the rear surface 352 of the substrate can be improved.

Figure 21:
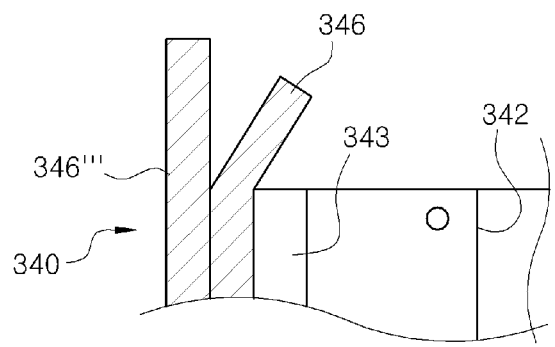

Moreover, a separate discharging nozzle 346''' may be further provided as in FIG. 21 outside the discharging member 346 of the second electrode 340 having a configuration of FIG. 17 in order to increase concentrating efficiency of plasma of reactive gas formed between the second electrode 340 and the rear surface 352 of the substrate and to improve process efficiency.

The discharging nozzle 346''' is disposed in the same direction as the discharging nozzle 342, and more specifically, is configured so that a plasma region formed from reactive gas can react with the entire area of the rear surface 352 of the substrate. Therefore, the discharging nozzle 346''' is disposed toward the arm 321 of the substrate supporter 320 or an outer direction thereof. Further, a separate gas is injected to prevent diffusion of reactive gas which is injected from the discharging nozzle 342 and the discharging member 346 toward the outer perimeter of the second electrode 340, that is, toward an outside over the discharging nozzle 346'' in a plan view. Herein, the injected gas may be a nonreactive gas, and the pressure of the nonreactive gas injected from the discharging nozzle 346''' is adjusted to be may be larger than or equal to the pressure of the reactive gas injected from the discharging nozzle 342 and the discharging member 346.

The non-reactive gas injected from discharging nozzle 346''' may have a higher insulation breakdown voltage than the reactive gas, and it may be preferable not to generate plasma due to the power applied to the second electrode 340.

The discharging nozzle 346''' may be installed in a plurality of layers around the periphery of the second electrode 340. In this case, the injection pressure of nonreactive gas may become higher along an outward direction.

Figure 22:
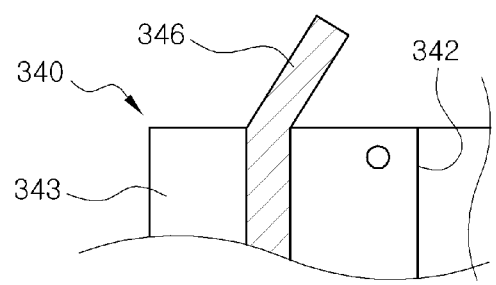

Also, referring to FIG. 22, the discharging nozzle 346, unlike the configurations in FIGS. 17 through 21, may be configured within an insulating ring 343. That is, the insulating ring 343 is disposed at the outermost region of the second electrode 340 in the configuration of FIG. 22. This configuration is also applicable to the discharging nozzles in FIGS. 18 through 21.

Figure 23:
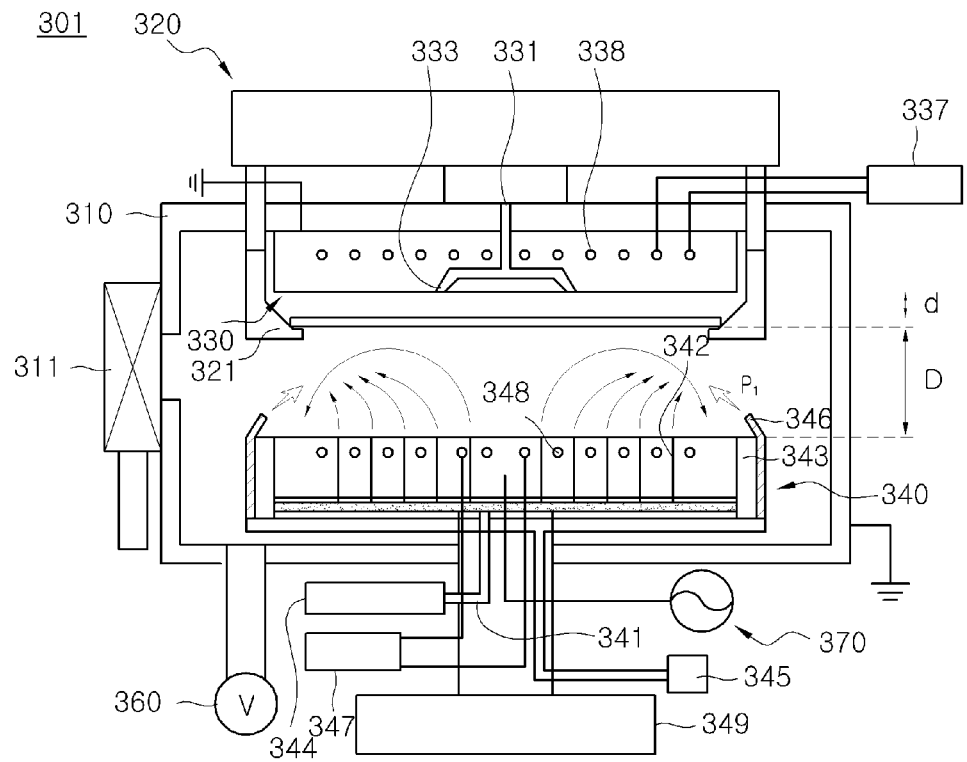
FIG. 23 is a schematic view illustrating the flow of gas in FIG. 15.

FIG. 23 schematically shows the flow of gas injected from the discharging nozzles 342 and the discharging member 346.

Referring to FIG. 23, reactive gas injected through the discharging nozzles 342 forms plasma between the second electrode 340 and the substrate 350. The plasma region does not become wider toward the outer perimeter of the second electrode 340 but is concentrated at the rear surface 352 of the substrate by the gas injected from around the periphery of the second electrode 340 toward a region in which the plasma is formed.

Of course, a gas injection angle of the discharging member 346 may be varied depending on process types and progress of the process.

The pressure ($P_1$) of the injected gas from the discharging member 346 may be adjusted to be sufficient to restrict the flow of the reactive gas injected from the discharging nozzles 342 only toward the second electrode 340.

Also, a nonreactive gas such as an inert gas may be injected from the discharging member 346 to reduce a consumption of nonreactive gas during processing.

An operation of the plasma processing apparatus in accordance with a fifth exemplary embodiment will be described in detail with reference to the drawings.

Figure 25:
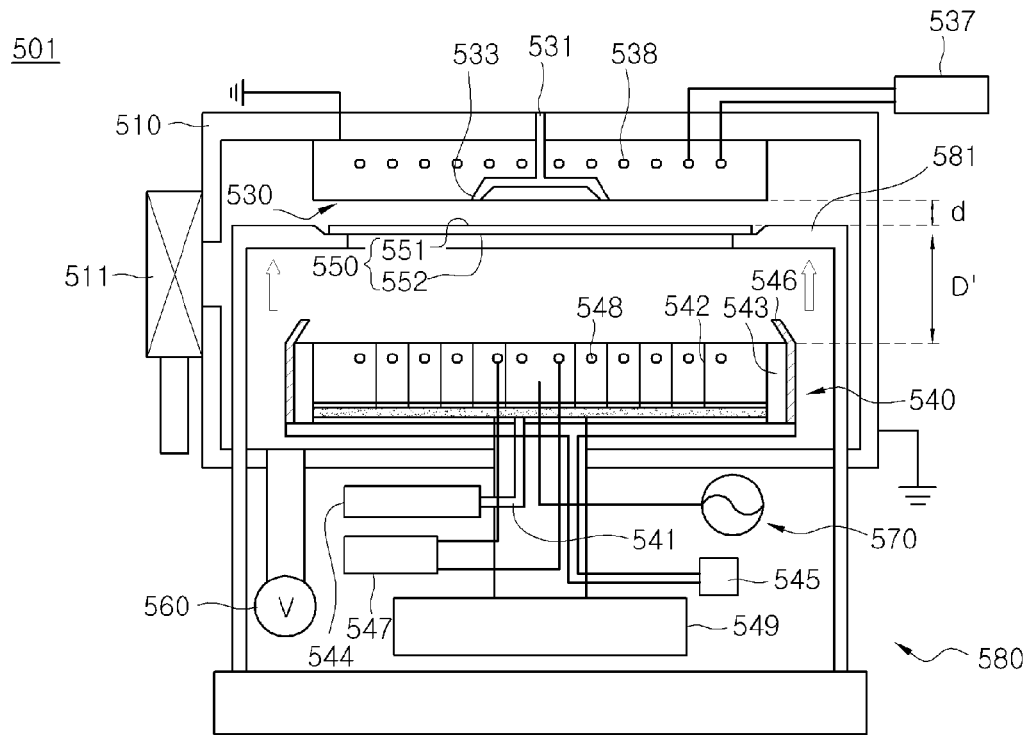
Figure 26:
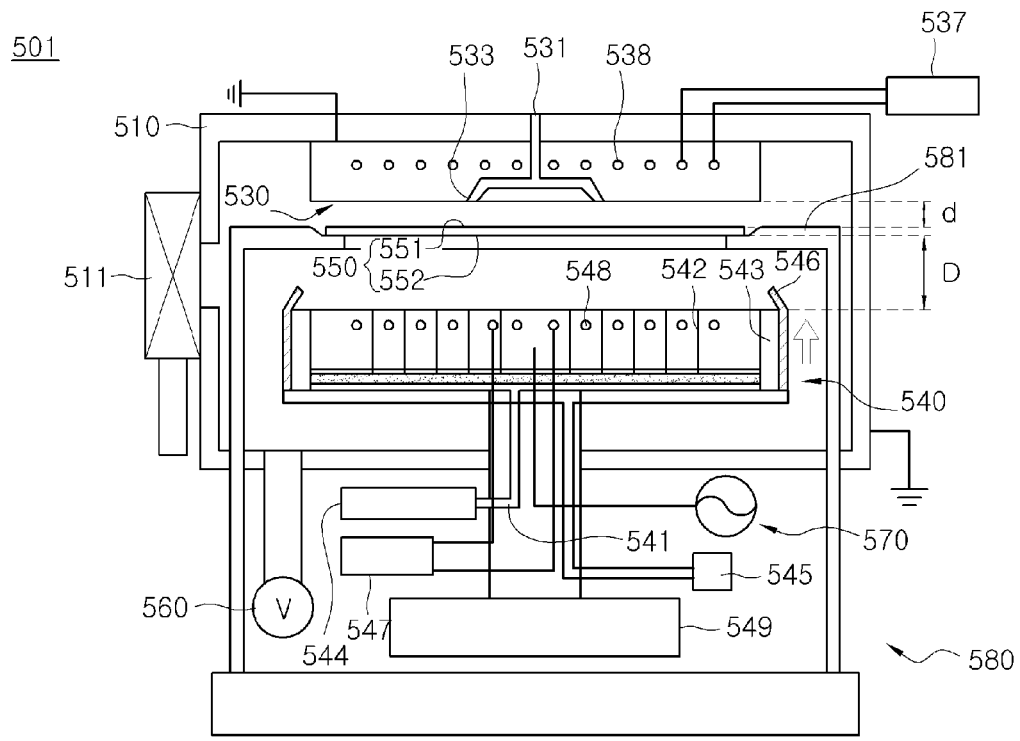
Figure 27:
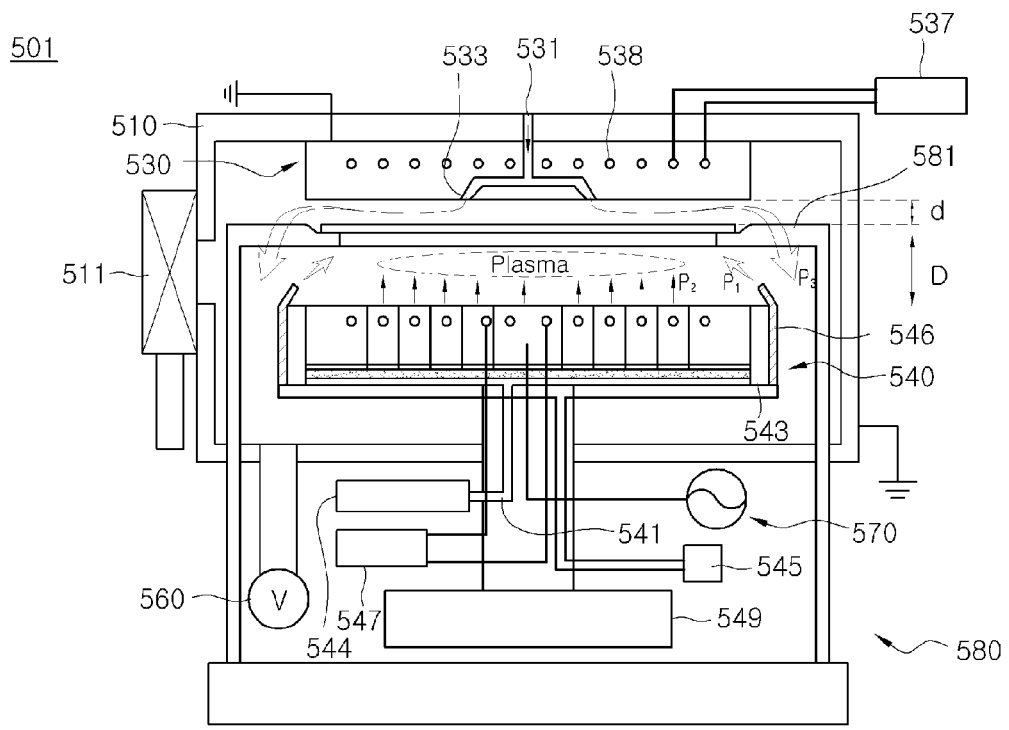

FIGS. 24 through 27 are views sequentially illustrating the operation of a plasma processing apparatus in accordance with the fifth exemplary embodiment, and in particular, the flow of gas is indicated in FIG. 27 by arrows.

The operation of the plasma processing apparatus in accordance with the fifth exemplary embodiment is a method for generating plasma to etch thin film and particles accumulated on a rear surface of a substrate 550 such as a wafer formed with a device having a predetermined thin film pattern.

The plasma processing apparatus illustrated in FIGS. 24 through 27 in accordance with the fifth exemplary embodiment is a combination of the substrate supporter 280 of the second exemplary embodiment described herein with reference to FIG. 2 and the second electrodes 340 and 440 of the third and fourth exemplary embodiments described herein with reference to FIGS. 8 and 9. The operation illustrated in FIGS. 24 through 27 can be similarly applicable to the first to fourth exemplary embodiments.

The operation of the plasma processing apparatus in accordance with the fifth exemplary embodiment of the present invention includes: seating a substrate 550 onto a substrate supporter 580 between a first electrode 530 and a second electrode 540 within a plasma processing apparatus 501 and; injecting a first gas into a gap between the substrate 550 and the first electrode 530; injecting a third gas toward a center of the second electrode 540; injecting a second gas toward the first electrode 530 from the second electrode 540; and plasma treating the second surface 552 of the substrate 550 by supplying power to the second electrode 540 and forming plasma of the second gas.

The plasma processing method used in the exemplary embodiments of the present invention includes seating a substrate 550 on a substrate supporter 580 between a first electrode 530 and a second electrode 540 within the plasma processing apparatus 501, fixing the seated substrate 550, injecting a first gas onto a first surface 551 and injecting a second gas onto a second surface 552 of the fixed substrate 550, and processing the second surface 552 of the substrate 550 by supplying power 570 to the injected second gas and generating plasma.

Figure 24:
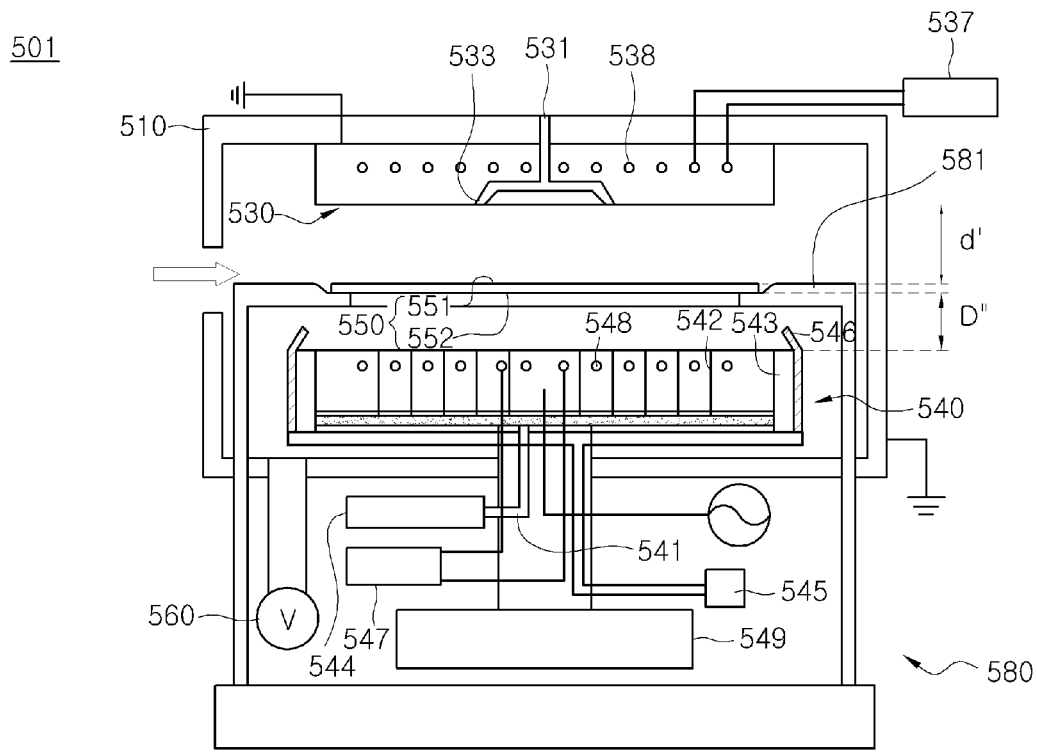
FIGS. 24 through 27 are views illustrating an operation of the plasma processing apparatus in accordance with a fifth exemplary embodiment.

As shown in FIG. 24, the substrate 550 is inserted through a separately provided entrance of the chamber 510, and is seated on the substrate supporter 580. The substrate 550 is supported on the substrate supporter 580 so that the front surface 551 faces discharging nozzles 533 of the first electrode 530 and the rear surface 552 faces discharging nozzles 542 of the second electrode 540.

In a configuration of FIG. 24, unlike FIG. 8, 9, or 11, a substrate supporter 580 supports the substrate 550 from below instead of the substrate supporter 320 and 420 supporting the substrate 550 from above. It should be noted that both configurations may be applied to all cases herein, and other configurations of substrate supporters may also be applied herein.

The substrate supporter 580 is disposed to be retreated from the first electrode 530 by a gap (d'), and the second electrode 540 is disposed to be retreated from the rear surface 552 of the substrate by a distance (D").

Referring to FIG. 25, an opening/closing member 511 seals the chamber 510 to form a vacuum, and the substrate supporter 580 is elevated by a driving member (not shown) so that the front surface 551 and the first electrode 530 are spaced apart with each other by a gap (d), where (d<d'). The substrate supporter 580 is elevated to reduce the gap (d) between the first electrode 530 and the front surface 551 of the substrate and, therefore, the distance between the second electrode 540 and the rear surface 552 of the substrate is increased from a distance (D") to a distance (D').

Thereafter, as shown in FIG. 26, the second electrode 540 is also elevated by a driving member 549 so that the rear surface 552 and the second electrode 540 are separated from each other by a distance (D), (D<D').

The gap (d) between the first electrode 530 and the substrate 550 or the distance (D) between the rear surface 552 of the substrate and the second electrode 540, as described herein, are not achieved only through the up and down movement of the substrate supporter 580 and the second electrode 540, but may be achieved through operating of at least one component of the first electrode 530, the substrate supporter 580, and the second electrode 540. For this end, each component may have a separate driving member.

Further, the distance (D) between the second electrode 540 and the rear surface 552 of the substrate is not necessarily required to be variable. The distance (D) may be any distance (D, D' or D") as long as it is suitable for generating plasma within the distance. Accordingly, the process may be performed after moving the substrate supporter 580 without moving the second electrode 540.

Of course, distances other than the distances (D, D' and D") may be employed, and the distance between the substrate supporter 580 and the second electrode 540 may be varied depending on required processes, the size of the chamber or substrate, etc. Of course, the distance may be varied even during the process.

Thereafter, as illustrated in FIG. 27, non-reactive gas is first introduced through the first electrode 530, and then reactive gas is introduced through the second electrode 540, and power is applied through the high frequency power supply 570 to generate reactive gas plasma.

The reactive gas is injected first through the discharge nozzle 542 of the second electrode 540. The non-reactive gas can be injected through the discharging member 546 prior to the reactive gas.

In a case where both of the discharge nozzle 542 and the discharging member 546 are configured to inject the reactive gas, the gas can be injected through any of the discharge nozzle 542 and the discharging member 546.

That is, for example, the reactive gas can be injected only through the discharging member 546 to form plasma, and non-reactive gas can be injected through a discharge nozzle 346''' which is further provided as shown in FIG. 21 to confine the reactive gas injected through the discharging member 546.

Further, when the configuration of the discharge nozzle 346''' illustrated in FIG. 21 is employed, the non-reactive gas may be injected through the discharge nozzle 346''' prior to injection of the reactive gas through the discharge nozzle.

In any cases, gas injection can be performed first in a peripheral region which is far from the center of the second electrode 540.

The plasma of the reactive gas is formed in a plasma generating region, and radicals in the plasma react with thin films or particles accumulated on the rear surface 552 of the substrate to remove them from the rear surface 552 of the substrate during an etching process.

Here, the plasma is generated within the distance (D) between the rear surface 552 of the substrate and the second electrode 540. Within the gap (d) between the first electrode 530 and the front surface 551 of the substrate, gas flows in a non-plasma state due to an inflow of the non-reactive gas.

Here, the gap (d) may be in a range of approximately 0.1 mm to 0.7 mm. If the gap (d) is less than 0.1 mm, the substrate may possibly get in contact with the first electrode 530. Therefore, to perform the process more stably, the gap (d) needs to be maintained greater than 0.1 mm. If the gap (d) exceeds 0.7 mm, the pressure of the non-reactive gas is relatively decreased, so that the radicals formed in the distance (D) may possibly get into the gap (d) and the front surface 551 of the substrate can be etched. Therefore, the gap (d) may be 0.7 mm or less. Further, if the gap exceeds 0.7 mm, non-reactive gas may be converted to plasma, and the front surface 551 of the substrate may be etched. However, when the gap (d) is 0.7 mm or less, it can be maintained as a region in which plasma is not generated when operated under pressures and voltages used in typical etching process.

The pressure of the non-reactive gas injected from the first electrode 530 may be equal to or greater than that of the reactive gas injected from the second electrode 540 to prevent penetration of plasma formed in the distance (D) into the gap (d).

The non-reactive gas injected from the first electrode 530 may have a higher insulation breakdown voltage than the reactive gas injected from the second electrode 540, so that it will not generate plasma due to the power applied to the second electrode 540.

The reactive gas injected from the second electrode 540 may be a highly reactive Group 7 element gas, for example, a fluorine-based gas such as $CF_4$, $CHF_4$, $SF_6$, $C_2F_6$, and $C_4F_8$, or a gas including oxygen. The reactive gas may be a gas including other types of elements capable of etching the thin films or particles depending on the type of thin films or particles accumulated on the rear surface 552 of the substrate in use.

By forming plasma with the above reactive gas, highly active radicals of the above elements are generated and react with elements that are subject to etching on the rear surface 552 of the substrate to perform etching.

The pressure ($P_2$) of the gas injected from the discharging nozzle 542 of the second electrode 540 is not greater than the pressure (P) of the gas injected from the discharging member 546 of the second electrode 240, so that the plasma of the reactive gas injected from the discharging nozzle 542 may be concentrated on the second electrode 540. Also, the gas pressure ($P_3$) of the nonreactive gas injected from the first electrode 530 is not less than the pressure ($P_2$) of the gas injected from the discharging nozzle 542 and the pressure ($P_1$) of the gas injected from the discharging member 546 of the second electrode 540, so that penetration of the reactive gas into the gap (d) can be prevented and concentration of the reactive gas plasma can be further secured.

In a case where configuration of the discharge nozzle 346''' as shown in FIG. 21 is employed, the pressure of the gas injected from the discharge nozzle 346''' may be equal to or greater than that of the gas injected from the second electrode 340. That is, the pressure of the non-reactive gas injected from the discharge nozzle 346''' is not smaller than that of the reactive gas injected from the second electrode 340 to improve concentration efficiency of the reactive gas plasma.

For the same purpose, when the discharging member 423 is provided to the substrate supporter 420 as shown in FIG. 16, the pressure of gas injected from the discharging member 423 may be equal to or greater than that of gas injected from the second electrode 440. That is, the pressure of the non-reactive gas injected from the discharging member 423 is not smaller than that of the reactive gas injected from the second electrode 440 to improve concentration efficiency of the reactive gas plasma.

The discharging member may inject gas toward the second electrode 440, and the discharge nozzle 346''' may inject gas toward the first electrode 330.

To restrict the plasma region, a separate magnetic field for restriction may be further formed using permanent magnets, electromagnets, or induced magnetic fields. Sometimes, plasma generating efficiency may be further improved by inducing oscillation of ions within the plasma through magnetic force. In this case, the magnetic fields generated may be differently formed according to the configuration of the chamber 510, substrate 550, first electrode 530, second electrode 540 and so forth.

The power supply 570 that applies power to the second electrode 540 may use a direct current, alternating current or the like instead of a high frequency power supply. A unipolar or bipolar pulse current may be used as the power supply. In this case, the electrical connection of the first electrode 530 or the second electrode 540 may be varied according to the power supply used, and a separate member for supplying power may be further provided.

When etching is completed, the supply of power is turned off, the supply of reactive gas and non-reactive gas is blocked, and etch byproducts are removed from the chamber 510 through vacuum exhausting. Here, the etch byproducts is in a gaseous state reacting with radicals of the plasma and, therefore, can be fully removed through vacuum exhausting.

When removal of etch byproducts is completed, the second electrode 540 is lowered by the driving member 549, and the substrate 550 is retreated from the first electrode 530 by means of the driving member of the substrate supporter 520.

Thereafter, the vacuum is broken, the opening/closing member 511 is opened, and the substrate 550 is unloaded, whereby the etching process is completed.

Figure 28:
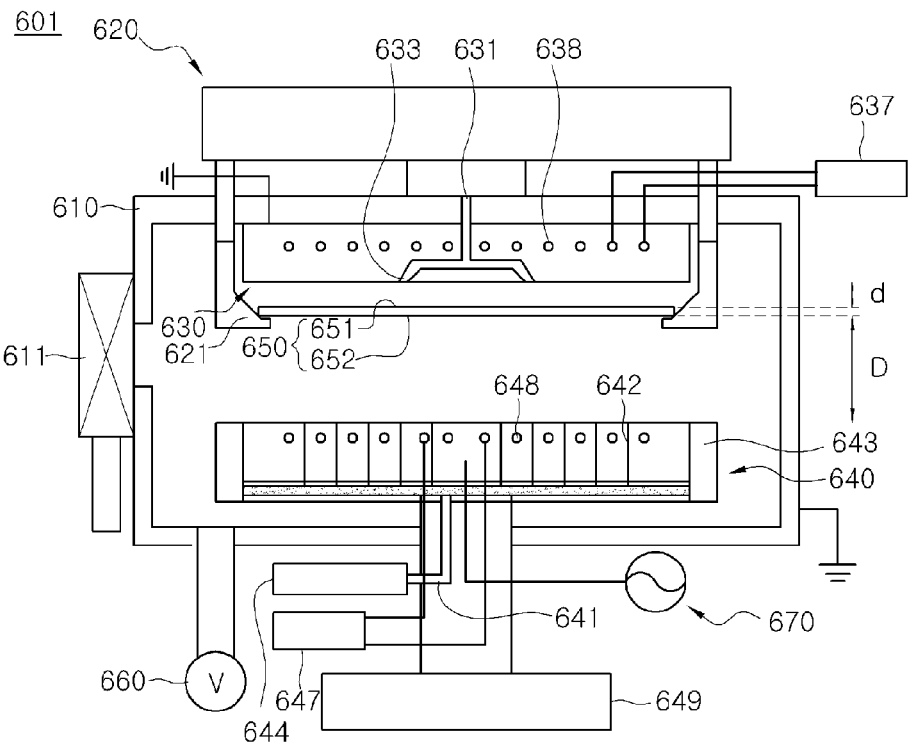
FIG. 28 is a schematic cross sectional view of a plasma processing apparatus in accordance with a sixth exemplary embodiment.

FIG. 28 is a schematic cross sectional view of a plasma processing apparatus in accordance with a sixth exemplary embodiment.

Referring to FIG. 28, a plasma processing apparatus 601 in accordance with the sixth exemplary embodiment includes a first electrode 630 at which a first gas is injected, a substrate supporter 620 which is spaced apart from the first electrode 630 so that the distance therebetween is adjustable and supports a substrate 650, and a second electrode 640 which is spaced apart from the substrate supporter 620 and generates plasma between the second electrode 640 and the substrate 650 supported by the substrate supporter 620, wherein power 670 is applied to the second electrode 640, and a second gas is injected from the second electrode 640.

According to the sixth exemplary embodiment, the plasma processing apparatus 601 is an etching apparatus that etches thin films and particles remaining on the rear surface of the substrate 650 such as a wafer on which a device having a predetermined thin film pattern is formed.

The plasma processing apparatus 601 includes a chamber 610 that can be opened or closed by an opening/closing member 611 such as a gate valve, and a typical vacuum exhausting system 660 communicating with the chamber 610.

The chamber 610 communicates with the outside through at least one opening/closing member 611, and may be a chamber 610 applied to a system including a plurality of chambers such as a cluster system or an inline system. Also, the chamber 610 is grounded so that current will not flow through the chamber 610.

The first electrode 630 is disposed within the upper portion of the chamber 610, and the first electrode 630 may be connected to ground. Also, a discharge nozzle 633 for discharging non-reactive gas is formed in the first electrode 630, and the discharge nozzle 633 communicates with a supply nozzle 631 so that non-reactive gas is supplied from outside the chamber 610.

A plurality of discharge nozzles 633 may be formed in the first electrode 630 so that non-reactive gas which is supplied from the outside of the chamber 610 through a single supply nozzle 631 can be uniformly injected throughout the entire surface of the first electrode 630 through which the non-reactive gas is injected. The plurality of discharge nozzles 633 communicates with and is branched from the supply nozzle 631 within the first electrode 630.

In a case where the discharge nozzles 633 are formed close to or far from a single supply nozzle 631 respectively, the discharge nozzle which is formed far from the discharge nozzles 633 may have a greater diameter than the discharge nozzle which is formed close to the discharge nozzles 633. Therefore, pressure decrease resulting from the longer distance of the gas flow can be compensated when the non-reactive gas is injected.

Coolant passages 638 connected to a coolant circulating member 637 configured outside the chamber 610 are provided within the first electrode 630.

Gas supplied through the supply nozzle 631 of the first electrode 630 may be hydrogen, nitrogen or inert gas, or it may be other non-reactive gas that does not react with the front surface 651 of a substrate.

Here, the front surface 651 of the substrate may be a surface of the substrate 650 such as a wafer on which a device having a predetermined thin film pattern is formed, or may be a surface of the substrate 650 that does not need to be etched.

The substrate 650 is spaced apart by a predetermined distance from a surface of the first electrode 630 on which the discharge nozzles 633 are formed so that the front surface 651 thereof is disposed facing the discharge nozzles 633, and is supported by the substrate supporter 620.

The substrate supporter 620 is configured to support the substrate 650 with arms 621 extending from the upper portion of the chamber 610, and the arms 621 are configured to be extendable by a driving member (not shown) provided to the substrate supporter 620 outside the chamber 610.

To maintain a vacuum seal with the configuration of the substrate supporter 620 which is extendable by the driving member, a portion at which the substrate supporter 620 exposed to outside the chamber 610 and the driving member are connected may have a compressible bellows-shaped configuration.

The arms 621 of the substrate supporter 620 may support only the external perimeter of the substrate 650, and supports only a portion of the external perimeter of the rear surface 652 of the substrate from the bottom in order to maximize the exposed region of the rear surface 652 of the substrate.

The arms 621 are connected to the driving member to move up and down, i.e., closer or further with respect to the first electrode 630, so that the substrate 650 supported by the arms 621 is also moved closer to or further with respect to the first electrode 630.

Here, the rear surface 652 of the substrate may be the other surface of the surface of a substrate 650 such as a wafer on which a device having with a predetermined thin film pattern is formed, or may be a surface of a substrate 650 requiring etching.

Through the up and down movement of the arms 621, a predetermined variable gap (d) is maintained between the front surface 651 of the substrate 650 and the surface of the first electrode 630 from which the non-reactive gas is discharged.

Also, the substrate supporter 620 may be configured to electrically float with respect to the plasma processing apparatus 601 so that it is not electrically interfered with other structural components. Also, the substrate supporter 620 including the arms 621 may be formed of insulating material such as $Al_2O_3$ to prevent damage of the substrate supporter 620 by external electric shocks.

The second electrode 640 is disposed below the substrate supporter 620 to be spaced apart from the substrate supporter 620 by a predetermined distance (D).

The second electrode 640 is configured to be supplied with power, and includes discharge nozzles 642 from which reactive gas is injected.

The discharge nozzles 642, similar to the discharge nozzles of the first electrode 630, are configured so that the reactive gas supplied from the outside of the chamber 610 through a supply nozzle 641 communicating with the discharge nozzles 642 can be injected into the chamber 610. The discharge nozzles 642 are provided in plurality facing the rear surface 652 of the substrate so that the reactive gas is uniformly injected throughout the entire rear surface 652 of the substrate 650 supported by the substrate supporter 620.

In the discharge nozzles 642 of the second electrode 640, a discharge nozzle 642 formed to be far from the supply nozzle 641 may have a greater diameter than a discharge nozzle 642 formed to be close to the supply nozzle 641, in order to compensate for pressure decrease resulting from the longer distance of the gas flow when the non-reactive gas is injected.

Besides the above configurations, the gas discharging configurations of the first electrode 630 or the second electrode 640 may be varied in various forms depending on requirements.

An insulating ring 643 is provided around the periphery of the second electrode 640 to concentrate plasma generated on the second electrode 640. The insulating ring 643 may be formed of an insulating material such as $Al_2O_3$.

Reactive gas which is discharged through the discharge nozzles 642 of the second electrode 640 may include a fluorine-based gas such as $CF_4$, $CHF_4$, $SF_6$, $C_2F_6$, and $C_4F_8$, or an oxygen-based gas, or may be a gas including other elements capable of chemically etching thin films or particles deposited on the rear surface 652 of the substrate.

The second electrode 640, like the substrate supporter 620, is configured to move up and down by means of a separate driving member 649 provided outside the chamber 610, so that a distance (D) between the rear surface 652 of the substrate 650 supported by the substrate supporter 620 and the second electrode 640 can be variable.

To maintain a vacuum seal with the second electrode 640 configured to move up and down by the driving member 649, a portion at which the second electrode 640 exposed to outside the chamber 610 is connected to the driving member 649 may have a compressible bellows-shaped configuration.

Also, coolant passages 648 connected to a coolant circulating member 647 configured outside the chamber 610 are provided within the second electrode 640. The coolant circulating member 647 may be the same member as the coolant circulating member 637 that circulates coolant in the first electrode 630.

The power supply 670 connected to the second electrode 640 may be a high frequency power supply having a frequency of an integer multiple of 13.56 MHz, or may be another power supply depending on the intended process, apparatus, etc. Here, the configuration of the high frequency power supply 670 connected to the second electrode 640 includes a matching device.

Due to the configuration of the grounded first electrode 630 and the second electrode 640 connected to the high frequency power supply 670, the first electrode 630 functions as an anode and the second electrode 640 functions as a cathode. An alternating oscillation of 13.56 MHz or an integer multiple of 13.56 MHz is provided between the anode and the cathode to increase plasma generating efficiency.

Figure 29:
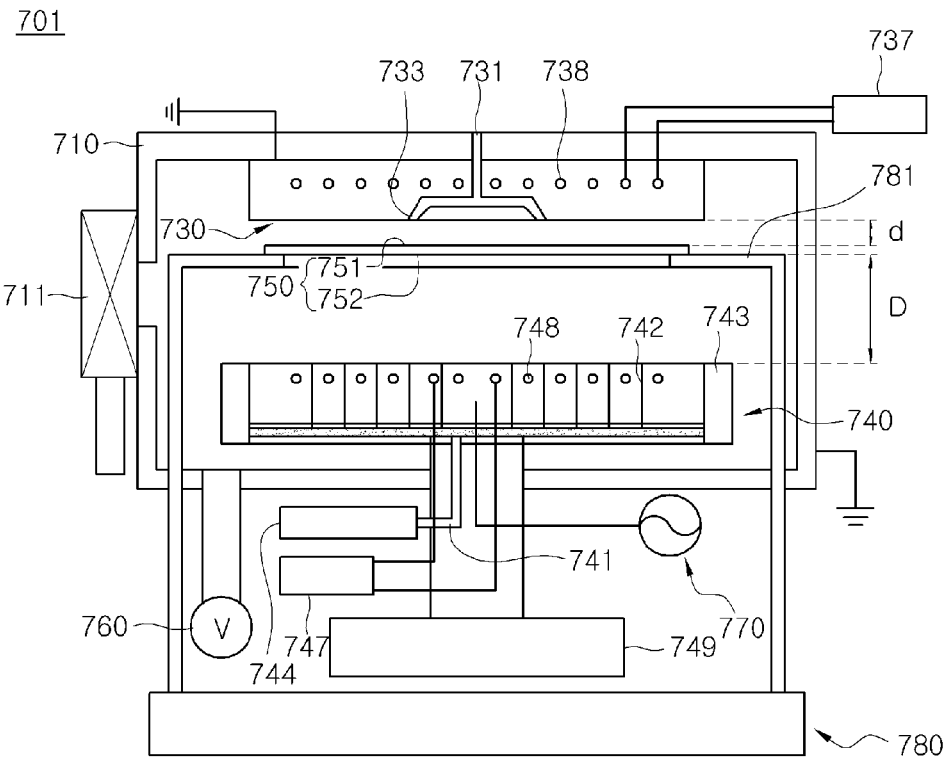
FIG. 29 is a schematic cross sectional view of a plasma processing apparatus in accordance with a seventh exemplary embodiment.
Figure 30:
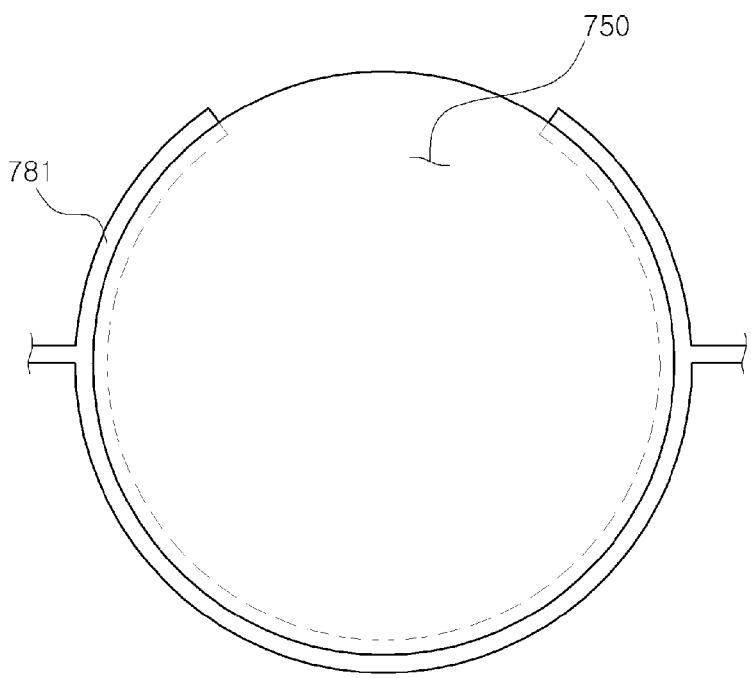
FIG. 30 is a partial plan view of the substrate supporter in FIG. 29 and a substrate supported thereon.

FIG. 29 is a schematic cross sectional view of a plasma processing apparatus in accordance with a seventh exemplary embodiment, and FIG. 30 is a partial plan view of the substrate supporter in FIG. 29 and a substrate supported thereon.

Unlike the substrate supporter 620 in FIG. 28 which suspends the substrate 650 from the upper portion of the chamber 610, that is, from the first electrode 630 to support the substrate 650, the substrate supporter 780 in FIG. 29 is provided at the lower portion of the chamber 710 to support the substrate 750.

The substrate supporter 780 in FIG. 29 also includes a driving member (not shown), and contacts and supports the substrate 750 with an arm 781 moving up and down by the driving member. By the up and down movement of the arm 781 by the driving member, a variable predetermined gap (d) is maintained between the front surface 751 of the substrate 750 and a surface of the first electrode 730 at which non-reactive gas is injected.

In a case of the substrate supporter 780 as shown in FIG. 29, like the substrate supporter 620 in FIG. 28, the arm 781 may support the outer peripheral portion of the substrate 750 to maximize the exposed area of the rear surface 752 of the substrate as illustrated in FIG. 30. Other configurations for the same purpose are also possible.

To maintain a vacuum seal with configuration in which the substrate supporter 780 moves up and down by the driving member, a portion of the substrate supporter 780 exposed to the outside the chamber 710 may have a compressible bellows-shaped configuration.

Figure 31:
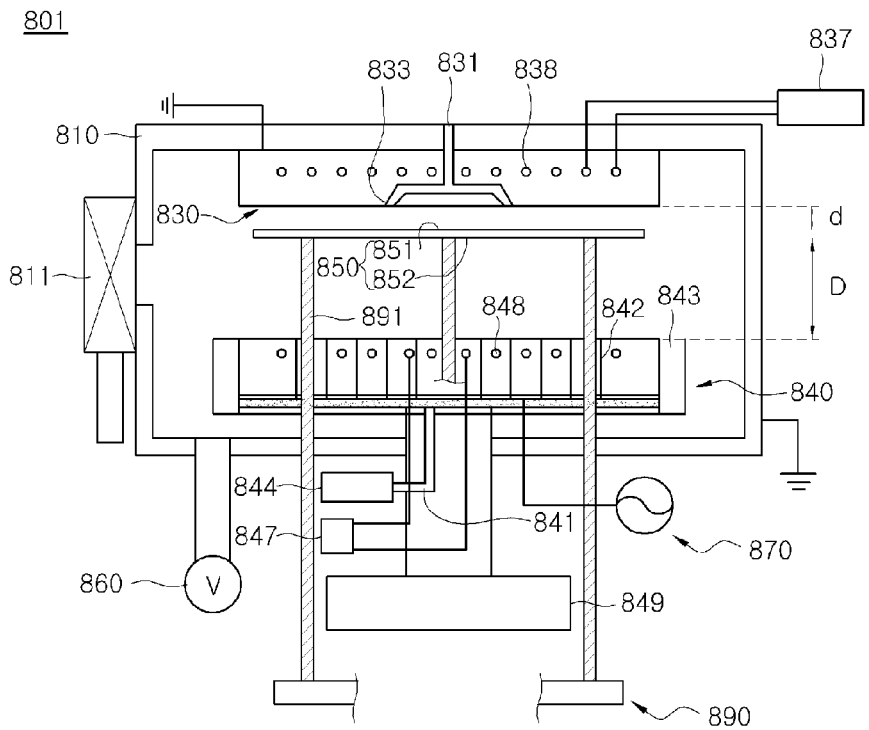
FIG. 31 is a schematic cross sectional view of a plasma processing apparatus in accordance with an eighth exemplary embodiment.

FIG. 31 is a schematic cross sectional view of a plasma processing apparatus in accordance with an eighth exemplary embodiment of the present invention.

Unlike the substrate supporters 620 and 780 in FIGS. 28 and 29 which support the periphery of the substrate 650 and 750 with the arms 621 and 781, the substrate supporter 890 in FIG. 31 is disposed below the chamber 810 and supports the substrate 850 with a plurality of pins 891.

The substrate supporter 890 in FIG. 31 also includes a driving member (not shown), and contacts and supports the substrate 850 with the pins 891 moving up and down by the driving member. The pins 891 are configured to have a sharp contacting portion with the rear surface 852 of the substrate to maximize the exposed area of the rear surface 852 of the substrate so that the contacting area with the rear surface 852 of the substrate can be minimized. And a plurality of pins 891 may integrally move up and down by the driving member while they are horizontally maintained.

Due to the up and down movement of the arms 891 by the driving member, a variable predetermined gap (d) is maintained between the front surface 851 of the substrate 850 and a surface of the first electrode 830 at which non-reactive gas is injected.

In any of FIGS. 28, 29, and 31, the gap (d) between the substrate supporter 620, 780 or 890 and the first electrode 630, 730 or 830 can be adjusted by a driving member, and when the substrate supporter 620, 780 or 890 are retreated from the first electrode 630, 730 or 830, the substrate 650, 750 or 850 may be inserted in or removed through the opening/closing member 611, 711 or 811 of the chamber 610, 710 or 810.

Figure 32:
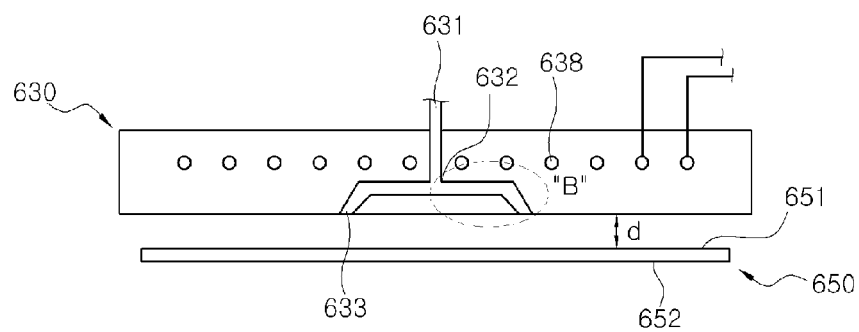
FIG. 32 is a partial view showing a first electrode and the substrate in FIG. 28.

FIG. 32 is a partial view showing a first electrode and a substrate in FIG. 28.

Referring to FIG. 32, a plurality of discharging nozzle 633 of the first electrode 630 is formed facing the front surface 651 of the substrate 650. The discharging nozzle 633 branches out in plurality at a branching point 632 of a supply nozzle 631 through which the non-reactive gas is supplied from outside.

The non-reactive gas supplied through the supply nozzle 631 is injected from the discharging nozzles 633, and the gap (d) between the substrate 650 and the first electrode 630 is maintained as a non-reactive gas atmosphere. To maintain the gap (d) to be in a non-reactive gas atmosphere even during etching process, that is, to block gases penetrated from outside of the gap (d), for example, the reactive gas injected from the second electrode 640 (in FIG. 28) or to block plasma of the reactive gas, the discharging nozzles 833 are formed to have a slope in the first electrode 830, and the slopes of the discharging nozzles 833 are configured to inject the non-reactive gas toward the outer perimeter of the substrate 850.

Referring to FIGS. 33 through 40, the configurations of the supply nozzle 631 and the discharging nozzles 633 of the first electrode 630 and the branching point 632 thereof will be described in further detail.

Figure 33:
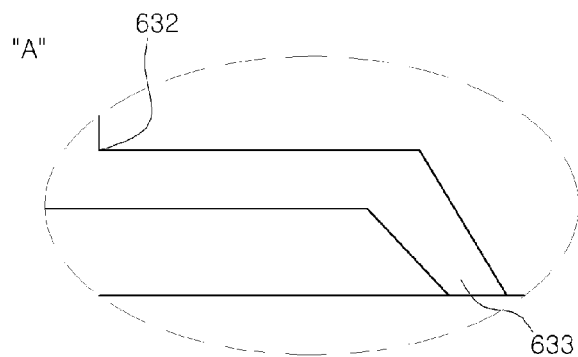
FIG. 33 is a partial enlarged view of region "B" in FIG. 32.

FIG. 33 is a partial enlarged sectional view of region "B" in FIG. 32.

As shown in FIG. 33, the discharging nozzle 633 branched from the supply nozzle 631 is bent to form a predetermined slope and configured to inject the non-reactive gas toward the outer perimeter of the substrate 650 (in FIG. 28). Here, the bent angle may be dependent on the size of the chamber 610 (in FIG. 28) or the size of the substrate 650.

Figure 34:
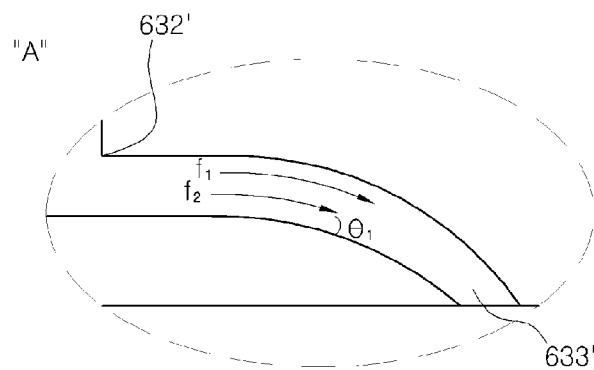
FIG. 34 is a first variant of FIG. 33.

FIG. 34 is a first variant of FIG. 33.

In FIG. 34, compared to FIG. 33, the passage of the discharging nozzle 633' from the branching point 632' to the surface of the first electrode 630 is formed to have a curved shape. In this case, the non-reactive gas passing through the discharging nozzle 633' receives less resistance of surface shear force than in the bent shape in FIG. 33, so that gas turbulence or loss of injection pressure can be reduced.

More preferably, in order to reduce the resistance of the surface shear force, the inclination angle ($\theta_1$) of a curve of the discharging nozzle 633' may be 7° or less. If the inclination angle ($\theta_1$) of the curve is formed to be greater than 7° the flow velocity of non-reactive gas is reduced by the surface shear force, injection pressure is reduced and, as a result, injection efficiency of the non-reactive gas is reduced.

Of course, the branching point 632' may also be formed to have a curved shape; however, the gas turbulence around the branching point 632' can be removed by the gas supplied from the supply nozzle 631.

If the inner diameters of the discharging nozzles 633' are the same, a flow ($f_1$) of the non-reactive gas that passes along the outer portion of the curve and is injected toward a relatively outer portion of the substrate 650 may flow longer than a flow ($f_2$) of non-reactive gas that passes along the inner portion of the curve and is injected toward a relatively inner portion of the substrate 650. As a result, the non-reactive gas injected along the inner gas flow ($f_2$) has a greater injection pressure than the non-reactive gas injected along the outer gas flow ($f_1$).

Accordingly, the inner and outer gas flows can be maintained to be the same by limiting the inner diameters of the discharging nozzles 633' from the branching point 632' to the surface of the first electrode 630 depending on the chamber 610 in use.

Figure 35:
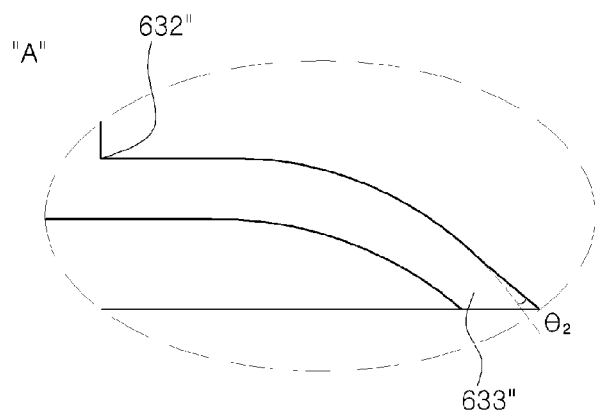
FIG. 35 is a second variant of FIG. 33.

FIG. 35 is a second variant of FIG. 33.

In FIG. 35, the inner diameter of the discharging nozzle 633" at the surface of the first electrode 630 is increased compared to FIG. 34. That is, the discharging nozzle 633" increases from the branching point 632" toward the surface of the first electrode 630.

Here, the increasing direction of the discharging nozzle 633" is toward the outer perimeter of the substrate 650 to which the non-reactive gas is injected, and the increased surface may be formed in a curved shape.

The increase or decrease of the discharging nozzle 633" may be determined based on required processes, type of gas used, or size of the chamber 610 or the substrate 650.

Here, the increased angle ($\theta_2$) may be 7° or less to reduce resistance of surface shear force. If the increased angle ($\theta_2$) is greater than 7° the flow velocity of non-reactive gas is reduced by surface shear force, so that injection pressure is reduced and the injecting efficiency of non-reactive gas is reduced as a result. In particular, the resistance at the front end with the increased inclination angle ($\theta_2$) is actually the resistance at the injecting end of the non-reactive gas. Therefore, it may adversely affect the gas injection pressure, and may result in a lower injection efficiency than the front end resistance of the inclination angle ($\theta_1$) of the curve.

Figure 36:
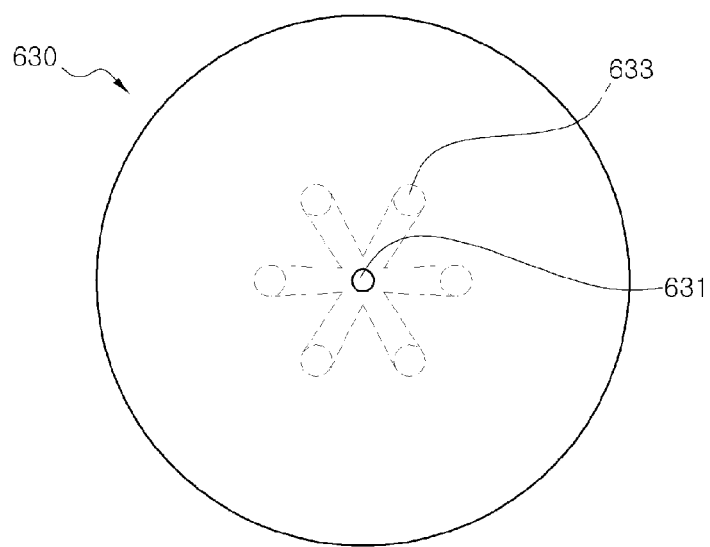
FIG. 36 is a plan view of a first electrode in FIG. 32.
Figure 37:
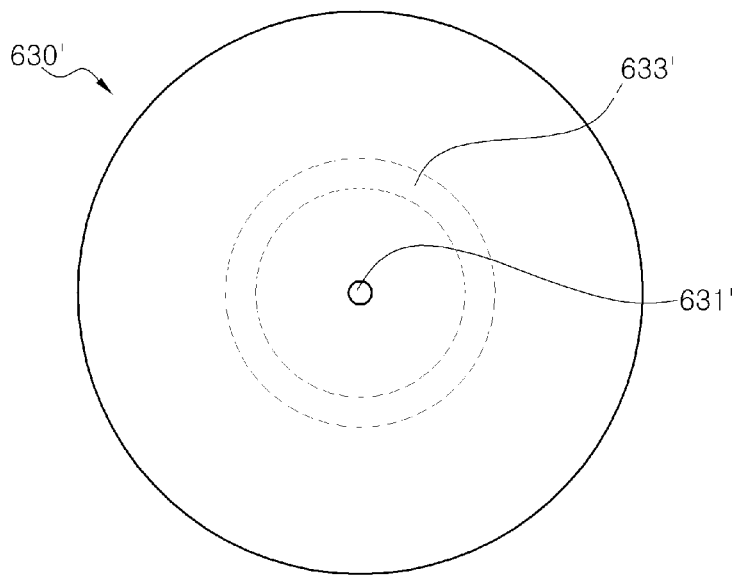
FIG. 37 is a first variant of FIG. 36.

FIG. 36 is a plan view of a first electrode in FIG. 32, and FIG. 37 shows a first variant of FIG. 36.

The discharging nozzles 633 branching from the supply nozzle 631 may be formed so that a plurality of tubes are arranged to have the same angular intervals as shown in FIG. 36, or may be formed as an annular concentric belt around the supply nozzle 631' as shown in FIG. 37.

Any of the tubular and annular discharging nozzles 633 and 633' may be applied to the first electrode 630 depending on the configuration or size of the chamber 610 or the substrate 650.

Figure 38:
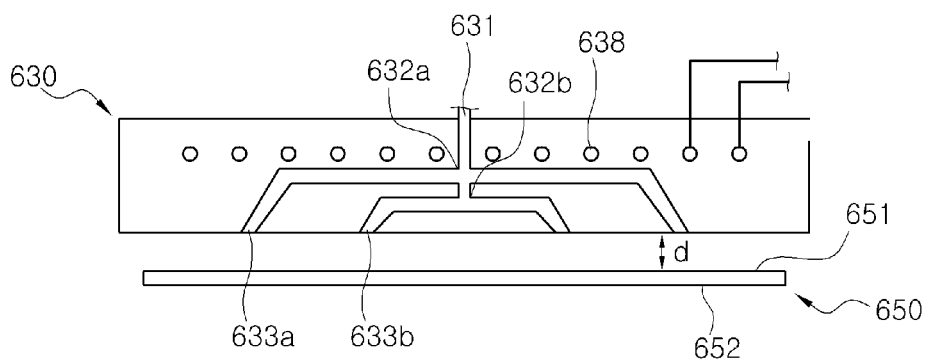
FIG. 38 is a variant of FIG. 32.
Figure 39:
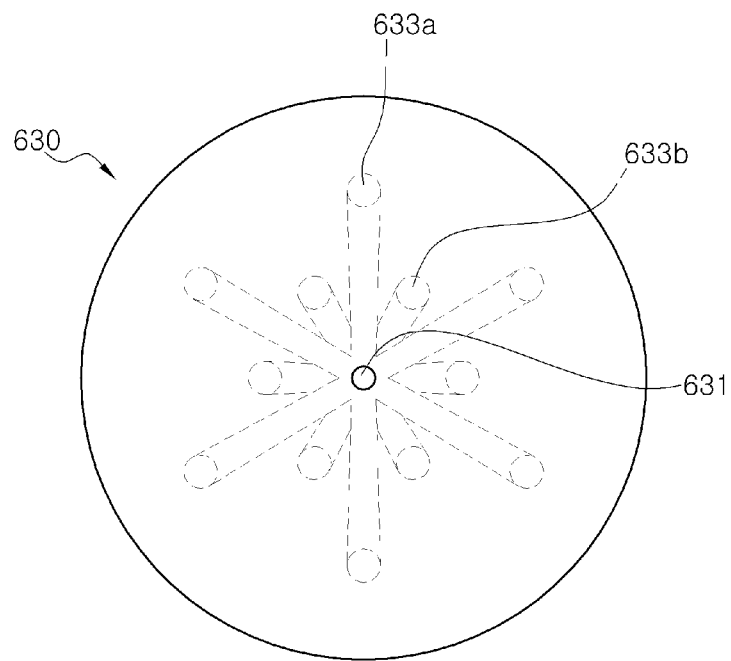
FIG. 39 is a plan view of a first electrode in FIG. 38.
Figure 40:
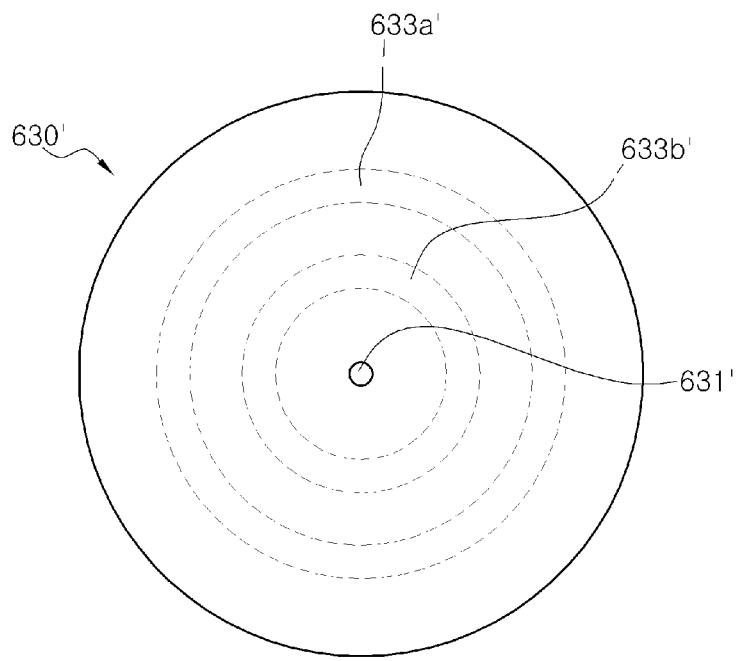
FIG. 40 is another example of FIG. 39.

FIG. 38 shows a variant of FIG. 32, FIG. 39 is a plan view of a first electrode in FIG. 38, and FIG. 40 is another example of FIG. 39.

Referring to FIG. 38, the supply nozzle 631 for supplying the non-reactive gas to be injected from the first electrode 630 may be configured to branch from a first branching point 632a located at an upper portion which is far from the substrate 650 in a vertical direction (as in FIG. 28) to first discharging nozzles 633a. And the supply nozzle 631 branches from a second branching point 632b located at a lower portion which is close to the substrate 650 to second discharging nozzles 633b. That is, in view of the flowing passage of the non-reactive gas, the passage first branches at the first branching point 632a and then branches again at the second branching point 632b.

In this case, the first discharging nozzles 633a that branch first may inject gas toward farther outer portion of the substrate 650 compared with the second discharging nozzles 633b. Here, the first discharging nozzles 633a may have larger inner diameters than the second discharging nozzles 633b, so that inflow of other gases from the outer portion of the substrate 650 into the gap (d) can be effectively blocked.

The non-reactive gas supplied at a uniform flow rate through the supply nozzle 631 first branches at the first branching point 632a and then flows to the second branching point 632b. To compensate for pressure decrease of the non-reactive gas from the first branching point 632a to the second branching point 632b and to ensure the amount of flow per unit time, the inner diameter may be decreased. In this case, the decrease of the inner diameter may be obtained by an abrupt decrease or a gradual decrease.

Of course, similar to the discharging nozzles 633, 633' and 633" described in reference to FIGS. 33 through 35, the inner diameters of the discharging nozzles 633a and 633b may be decreased or increased from the first discharging nozzle 633a and the second discharging nozzle 633b to the surface of the first electrode 630 depending on the chamber 610 in use and so forth. Increase or decrease of the nozzles may be determined by required processes or the type of gas used, or the size of the chamber 610 or substrate 650.

Like the configurations of FIGS. 36 and 37 having the single branching point 632, the discharging nozzles 633a and 633b of the first electrode 630 having the first branching point 632a and the second branching point 632b may be formed so that a plurality of tubes are arranged to have the same angular intervals (FIG. 39), may be formed as an annular concentric belt around the supply nozzle 631' (FIG. 40).

Of course, besides the two branching points 632a and 632b as shown in FIGS. 38 through 40, 3 or more branching points may be formed.

Of course, it may branch on the way of the passages of the discharging nozzles 633, 633a, 633a', 633b and 633b'. In this case, the inner diameters may be determined based on consideration about compensating for pressure decrease at branching points and ensuring the amount of flow per unit time.

A plasma processing method in accordance with the first exemplary embodiment will be described in detail with reference to the accompanying drawings.

Figure 42:
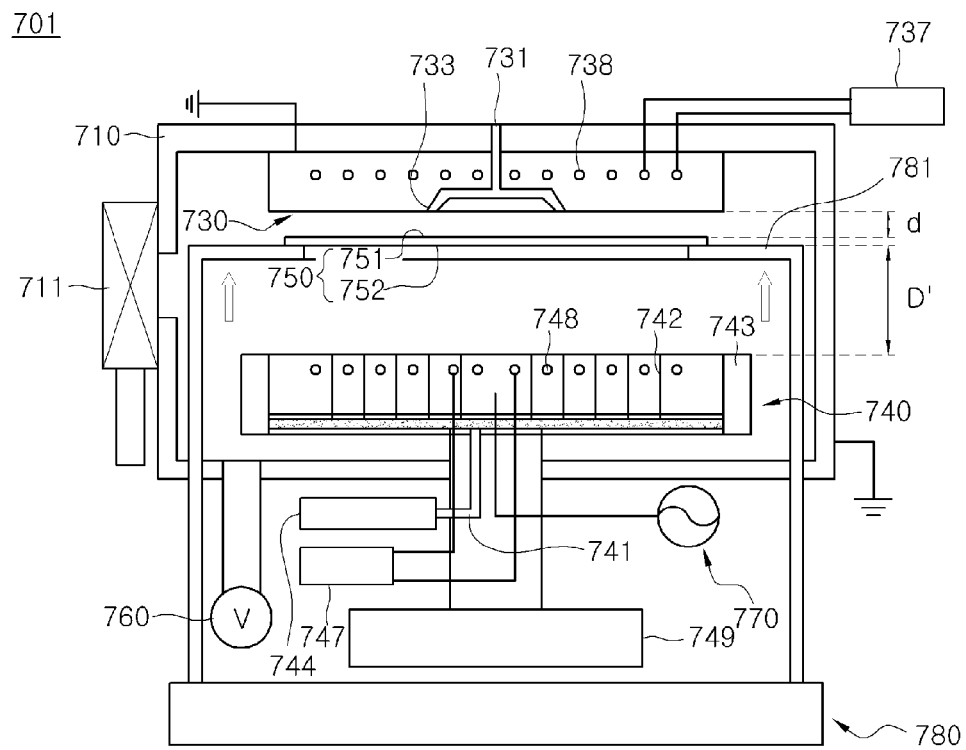
Figure 43:
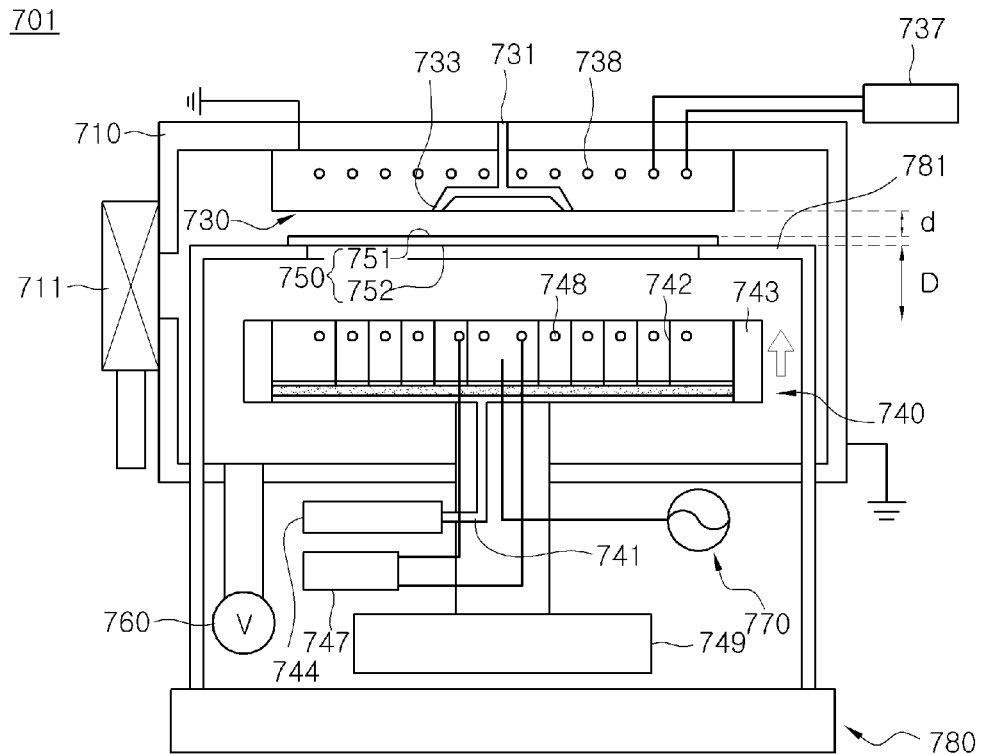
Figure 44:
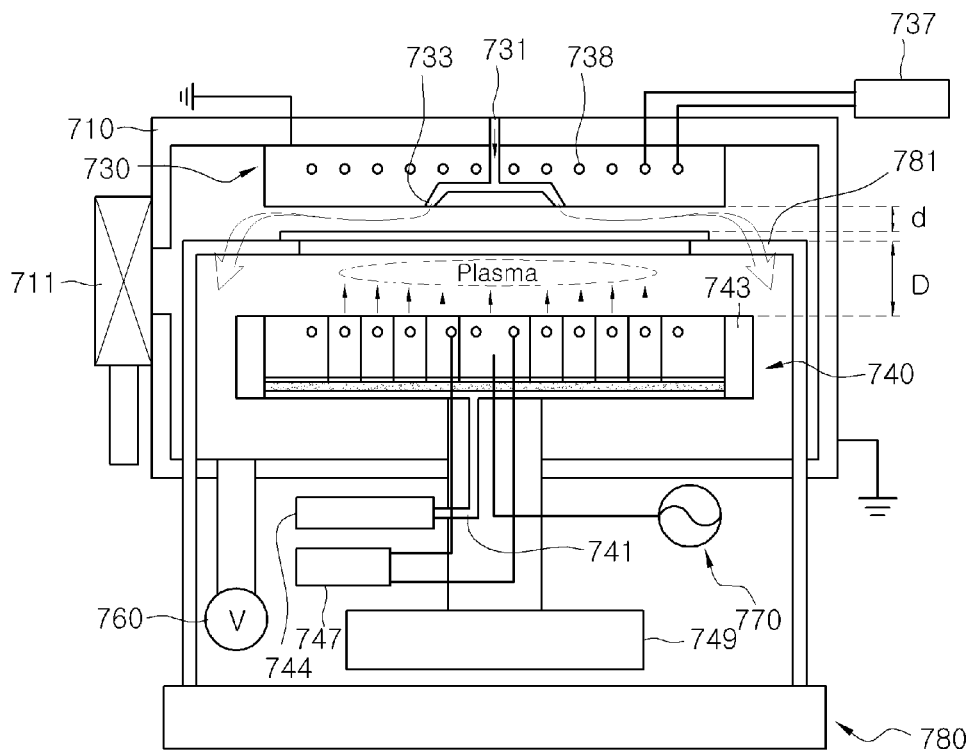

FIGS. 41 through 44 are views illustrating a plasma processing method in accordance with the first exemplary embodiment of the present invention, and in particular, the flow of gas is indicated by arrows in FIG. 44.

The plasma processing method used in the first exemplary embodiment of the present invention is a method for generating plasma to etch thin films and particles accumulated on a rear surface of a substrate 750 such as a wafer formed with a device having a predetermined thin film pattern.

The plasma processing method used in the first exemplary embodiment of the present invention includes seating a substrate 750 on a substrate supporter 780 between a first electrode 730 and a second electrode 740 within the plasma processing apparatus 701, fixing the seated substrate 750, injecting a first gas onto a first surface 751 and injecting a second gas onto a second surface 752 of the fixed substrate 750, and processing the second surface 752 of the substrate 750 by supplying power 770 to the injected second gas and generating plasma.

Figure 41:
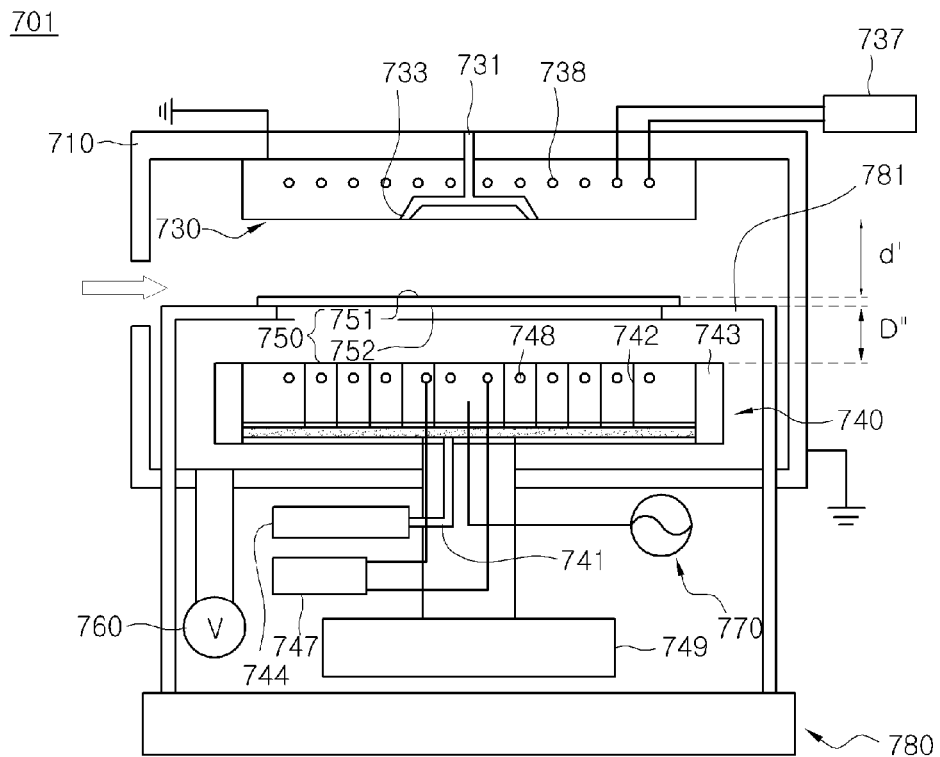
FIGS. 41 to 44 are views illustrating an exemplary embodiment of a plasma processing method of the present invention.

As shown in FIG. 41, the substrate 750 is inserted through a separately provided entrance of the chamber 710, and is seated on the substrate supporter 780. The substrate 750 is supported on the substrate supporter 780 so that the front surface 751 faces discharging nozzles 733 of the first electrode 730 and the rear surface 752 faces discharging nozzles 742 of the second electrode.

Here, the substrate supporter 780 may be the substrate supporter 620 described with reference to FIG. 28, and may be the substrate supporter 890 described with reference to FIG. 31.

In any cases, the substrate supporter 780 is disposed to be retreated from the first electrode 730 by a gap (d'), and the second electrode 740 is disposed to be retreated from the first electrode 730 by a distance (D").

Referring to FIG. 42, an opening/closing member 711 seals the chamber 710 to form a vacuum, and the substrate supporter 780 is elevated by a driving member (not shown) so that the front surface 751 and the first electrode 730 are spaced apart with each other by a gap (d), where (d<d'). The substrate supporter 780 is elevated to reduce the gap (d) between the first electrode 730 and the front surface 751 of the substrate and, therefore, the distance between the second electrode 740 and the rear surface 752 of the substrate is increased from a distance (D") to a distance (D').

Thereafter, as shown in FIG. 43, the second electrode 740 is also elevated by a driving member 749 so that the rear surface 752 and the second electrode 740 are separated from each other by a distance (D), (D<D').

The gap (d) between the first electrode 730 and the substrate 750 or the distance (D) between the substrate 750 and the second electrode 740, as described herein, are not achieved only through the up and down movement of the substrate supporter 780 and the second electrode 740, but may be achieved through operating of at least one component of the first electrode 730, the substrate supporter 780, and the second electrode 740. For this end, each component may have a separate driving member.

Further, the distance (D) between the second electrode 740 and the rear surface 752 of the substrate is not necessarily required to be variable. The distance (D) may be any distance (D, D' or D") as long as it is suitable for generating plasma within the distance. Accordingly, the process may be performed after moving the substrate supporter 780 without moving the second electrode 740.

Of course, distances other than the distances (D, D' and D") may be employed, and the distance between the substrate supporter 780 and the second electrode 740 may be varied depending on required processes, the size of the chamber or substrate, etc. Of course, the distance may be varied even during the process.

Thereafter, as illustrated in FIG. 44, non-reactive gas is first introduced through the first electrode 730, and then reactive gas is introduced through the second electrode 740, and power is applied through the high frequency power supply 770 to generate reactive gas plasma.

The plasma of the reactive gas is formed in a plasma generating region, and radicals in the plasma react with thin films or particles accumulated on the rear surface 752 of the substrate to remove them from the rear surface 752 of the substrate during an etching process.

Here, the plasma is generated within the distance (D) between the rear surface 752 of the substrate and the second electrode 740. Within the gap (d) between the first electrode 730 and the front surface 751 of the substrate, gas flows in a non-plasma state due to an inflow of the non-reactive gas.

Here, the gap (d) may be in a range of approximately 0.1 mm to 0.7 mm. If the gap (d) is less than 0.1 mm, the substrate may possibly get in contact with the first electrode 730. Therefore, to perform the process more stably, the gap (d) needs to be maintained greater than 0.1 mm. If the gap (d) exceeds 0.7 mm, the pressure of the non-reactive gas is relatively decreased, so that the radicals formed in the distance (D) may possibly get into the gap (d) and the front surface 751 of the substrate can be etched. Therefore, the gap (d) may be 0.7 mm or less. Further, if the gap exceeds 0.7 mm, non-reactive gas may be converted to plasma, and the front surface 751 of the substrate may be etched. However, when the gap (d) is 0.7 mm or less, it can be maintained as a region in which plasma is not generated when operated under pressures and voltages used in typical etching process.

The non-reactive gas injected from the first electrode 730 may have a higher insulation breakdown voltage than the reactive gas injected from the second electrode 740, so that it will not generate plasma due to the power applied to the second electrode 740.

The reactive gas injected from the second electrode 740 may be a highly reactive Group 7 element gas, for example, a fluorine-based gas such as $CF_4$, $CHF_4$, $SF_6$, $C_2F_6$, and $C_4F_8$, or a gas including oxygen. The reactive gas may be a gas including other types of elements capable of etching the thin films or particles depending on the type of thin films or particles accumulated on the rear surface 752 of the substrate in use.

By forming plasma with the above reactive gas, highly active radicals of the above elements are generated and react with elements that are subject to etching on the rear surface 752 of the substrate to perform etching.

To restrict the plasma region, a separate magnetic field for restriction may be further formed using permanent magnets, electromagnets, or induced magnetic fields. Sometimes, plasma generating efficiency may be further improved by inducing oscillation of ions within the plasma through magnetic force. In this case, the magnetic fields generated may be differently formed according to the configuration of the chamber 710, substrate 750, first electrode 730, second electrode 740 and so forth.

The power supply 770 that applies power to the second electrode 740 may use a direct current, alternating current or the like instead of a high frequency power supply. A unipolar or bipolar pulse current may be used as the power supply. In this case, the electrical connection of the first electrode 730 or the second electrode 740 may be varied according to the power supply used, and a separate member for supplying power may be further provided.

When etching is completed, the supply of power is turned off, the supply of reactive gas and non-reactive gas is blocked, and etch byproducts are removed from the chamber 710 through vacuum exhausting. Here, the etch byproducts is in a gaseous state reacting with radicals of the plasma and, therefore, can be fully removed through vacuum exhausting.

When removal of etch byproducts is completed, the second electrode 740 is lowered by the driving member 749, and the substrate 750 is retreated from the first electrode 730 by means of the driving member of the substrate supporter 720.

Thereafter, the vacuum is broken, the opening/closing member 711 is opened, and the substrate 750 is unloaded, whereby the etching process is completed.

In the above description, the exemplary plasma processing method has been described with reference to the plasma processing apparatus in accordance with the seventh embodiment of the present invention. However, the exemplary plasma processing method can be applied to other plasma processing apparatuses and other equipments described herein in accordance with other exemplary embodiments.

Hereinafter, a method for plasma processing will be described with reference to the accompanying drawings in accordance with another exemplary embodiment.

FIGS. 45 through 48 are sequential views for explaining a plasma processing method in accordance with the exemplary embodiments of the present invention. Particularly, in FIG. 48, gas flow paths for processing a substrate are indicated by arrows.

The plasma processing method in accordance with the current embodiment may be a method of etching a thin layer or particles deposited on a rear surface 950 of a substrate such as a wafer on which devices having predetermined thin film patterns are formed by plasma patterning.

The plasma processing method in accordance with the current embodiment includes: seating a substrate on a substrate supporter 920a first electrode 930 and a second electrode 940 of a plasma processing apparatus 901 between; adjusting a gap (d) between the substrate 950 and the first electrode 930; adjusting a distance (D) between the substrate 950 and the second electrode 940; injecting a first gas onto a first surface 951 of the substrate 950; injecting a third gas in an oblique direction from the periphery to the center of the second electrode 940; injecting a second gas onto a second surface 952 of the substrate 950; and applying power to the second electrode 940 to form plasma for treating the second surface 952 of the substrate 950 using the plasma.

Figure 45:
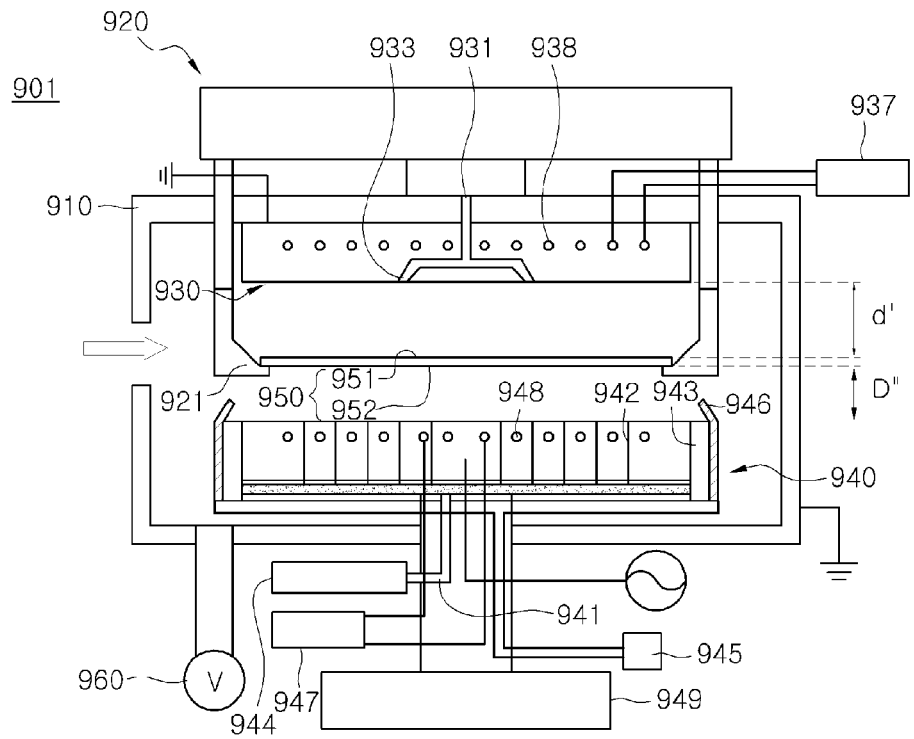
FIGS. 45 to 48 are views illustrating another exemplary embodiment of a plasma processing method of the present invention.

As shown in FIG. 45, the substrate 950 is introduced into a chamber 910 through an additional inlet and is placed on the substrate supporter 920. The substrate 950 is supported on the substrate supporter 920 with the front surface 951 of the substrate 950 facing discharge nozzles 933 of the first electrode 930 and the rear surface 952 of the substrate 950 facing discharge nozzles 942 of the second electrode.

Referring to FIGS. 45 through 48, the substrate supporter 920 extends downward from an upper portion of the plasma processing apparatus to support the substrate 950. However, other structures can be used for supporting the substrate 950 from other portion not from the upper portion.

The substrate supporter 920 is disposed to be retreated from the first electrode 930 by a gap (d'), and the second electrode 940 is also disposed to be retreated from the first electrode 930 by a distance (D").

Figure 46:
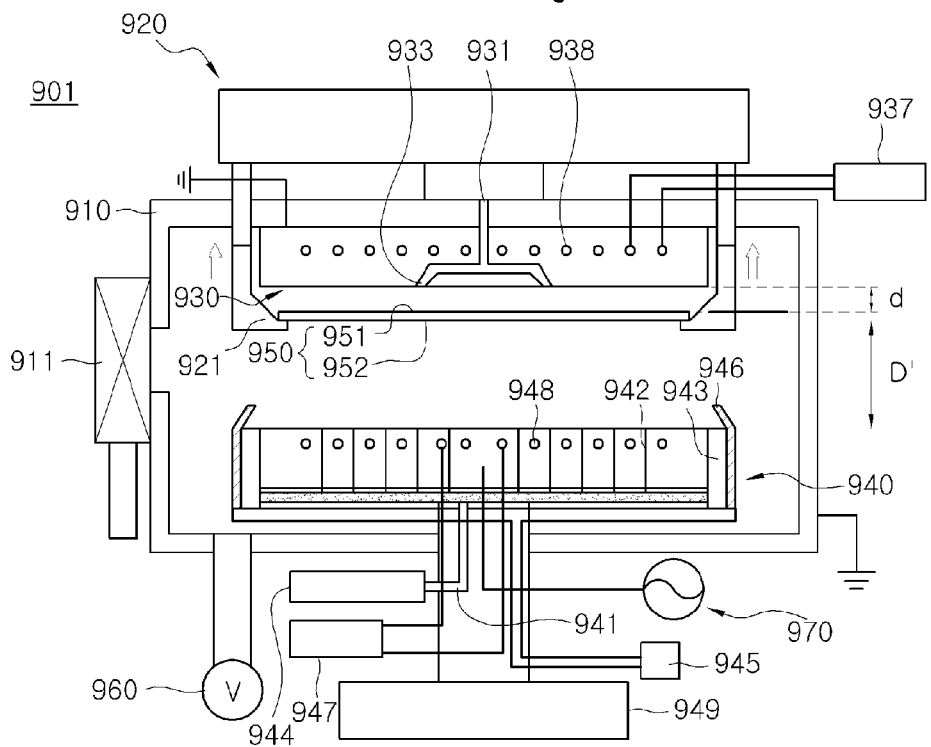

Referring to FIG. 46, the chamber 910 is closed using an opening/closing member 911, and a vacuum is formed in the chamber 910. Then, the substrate supporter 920 is lifted by a driving unit (not shown) until the front surface 951 of the substrate 950 is spaced apart from the first electrode 930 by a gap (d) (d<d'). As the gap between the front surface 951 of the substrate 950 reduces due to the lift of the substrate supporter 920, the distance between the rear surface 952 of the substrate 950 and the second electrode 940 increases from D" to D'.

Figure 47:
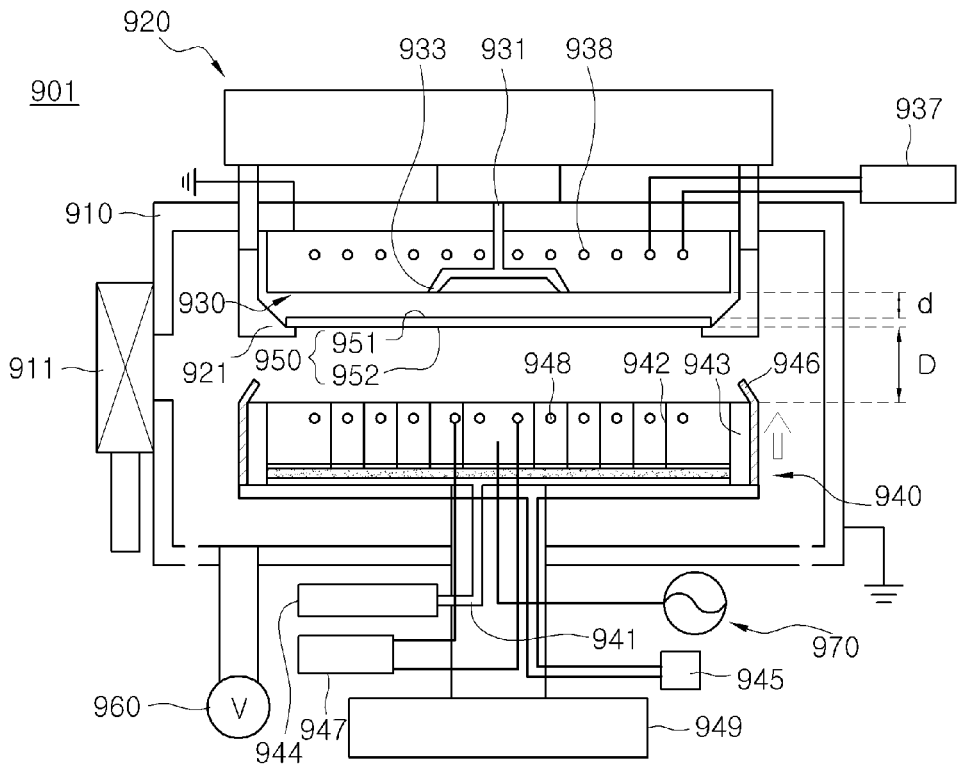

Thereafter, referring to FIG. 47, the second electrode 940 is lifted by a driving unit 949 until the distance between the rear surface 952 of the substrate 950 and the second electrode 940 becomes D (D<D').

The gap (d) between the first electrode 930 and the substrate 950 or the distance (D) between the substrate 950 and the second electrode 940, as described herein, are not achieved only through the up and down movement of the substrate supporter 920 and the second electrode 940, but may be achieved through operating of at least one component of the first electrode 930, the substrate supporter 920, and the second electrode 940. For this end, each component may have a separate driving member.

Instead of varying the distance (D) between the rear surface 952 of the substrate 950 and the second electrode 940, the distance (D) may be fixed to, for example, D, D', and D" as long as a plasma can be formed between the fixed substrate 950 and the second electrode 940. That is, a process may be performed after adjusting only the substrate supporter 920 but the second electrode 940.

Of course, the distance (D) may be fixed to other values as well as D, D', and D" that are indicated in the drawings. The distance between the substrate supporter 920 and the second electrode 940 may be varied according to processes, chamber sizes, or substrate sizes. In addition, the distance between the substrate supporter 920 and the second electrode 940 may be varied during a process.

Figure 48:
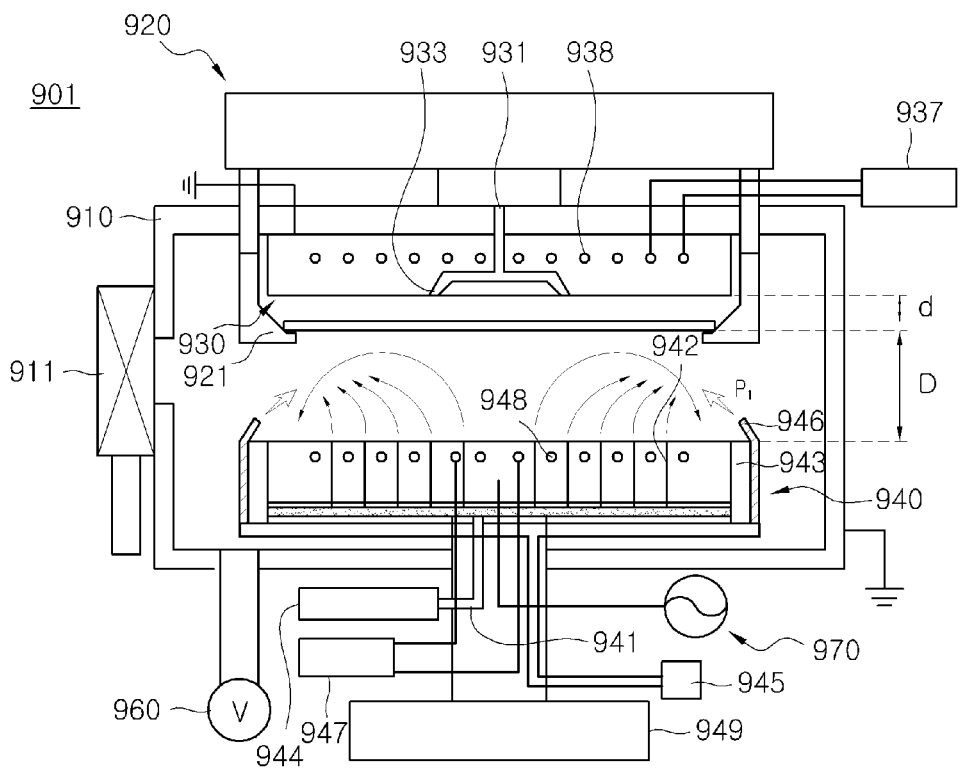

Thereafter, referring to FIG. 48, a non-reactive gas is supplied through the first electrode 930, and then a reactive gas is supplied through the second electrode 940. Next, power is supplied from a high-frequency power supply 970 to form a reactive gas plasma.

Here, the reactive gas may be injected through the discharge nozzle 942 of the second electrode 940, and a non-reactive gas may be injected through a discharging member 946 before the injection of the reactive gas.

Alternatively, both the discharge nozzles 942 and the discharging member 946 may be configured to inject a reactive gas. In this case, the reactive gas may be injected through the discharge nozzle 942 or the discharging member 946.

That is, in any case, injection of gas at the second electrode 940 may start from the most distant peripheral region of the second electrode 940.

The reactive gas plasma is formed in a plasma generation region, and radicals of the reactive gas plasma react with a layer or particles deposited on the rear surface 952 of the substrate 950 and remove the layer or particles from the rear surface 952 of the substrate 950. In this way, an etch process is performed.

Here, the reactive gas plasma is formed in a space (D) between the rear surface 952 and the second electrode 940, and non-reactive gas in non-plasma state flows through the gap (d) between the front surface 951 and the first electrode 930.

The relationship between etch process and gap (d) is shown in Table 1 below.

TABLE 1

| | d [mm] | | | | | | |
|---|---|---|---|---|---|---|---|
| | <0.1 | 0.1 | 0.3 | 0.5 | 0.7 | 0.9 | 1.0< |
| Plasma formation | X | X | X | X | X | O | O |
| Substrate front surface etch | Interference | X | X | X | X | O | O |

If the gap (d) is less than approximately 0.1 mm, the possibility of interfering with the first electrode 930 exists, and mechanical controlling is difficult. Thus, the gap (d) may be kept equal to or greater than approximately 0.1 mm for stably performing an etch process and preventing physical interferences. If the gap (d) is greater than approximately 0.7 mm, since the pressure of non-reactive gas of the gap (d) is relatively low, the front surface 951 can be etched by radicals permeated from the space (D) to the gap (d). Thus, the gap (d) may be kept equal to or less than approximately 0.7 mm. Moreover, if the gap (d) is greater than approximately 0.7 mm, the state of the non-reactive gas starts to change to a plasma state, and thus the front surface 951 can be etched. However, if the gap (d) is equal to or less than approximately 0.7 mm, plasma does not generate in the gap (d) under pressure and voltage conditions of a general etch process.

Therefore, the gap (d) may be kept in the range of approximately 0.1 mm to approximately 0.7 mm.

The pressure of the non-reactive gas injected through the first electrode 930 may be equal to or higher than the pressure of the reactive gas injected through the second electrode 940 so as to prevent plasma from moving from the space (D) to the gap (d).

The non-reactive gas injected through the first electrode 930 may have an insulation breakdown voltage greater than that of the reactive gas injected through the second electrode 940. The non-reactive gas injected through the first electrode 930 may not change into plasma by power applied to the second electrode 940.

The reactive gas injected through the second electrode 940 may be an oxygen ($O_2$) based gas, or a group 7 element based gas such as chlorine (Cl) based gas and fluorine (F) based gas. Examples of the fluorine (F) based gas include $CF_4$, $CHF_4$, $SF_6$, $C_2F_6$, $NF_3$, $F_2$, $F_2N_2$, and $C_4F_8$. Examples of the chlorine (Cl) based gas include $BCl_3$ and $Cl_2$. Gas including other elements can be used as the reactive gas according to a layer or particles deposited on the rear surface 952 of the substrate 950.

When the reactive gas changes into plasma, radicals of the above-listed elements become very reactive and react with etch-target elements deposited on the rear surface 952. In this way, the rearsurface 952 may be etched.

The pressure $P_2$ of reactive gas injected through the discharge nozzle 942 of the second electrode 940 is not higher than the pressure $P_1$ of gas injected through the discharging member 946 of the second electrode 940 such that formation of reactive gas plasma can be concentrated on the second electrode 940. The pressure $P_3$ of non-reactive gas injected through the first electrode 930 is not lower than the pressure $P_2$ of reactive gas injected through the discharge nozzles 942 and the pressure $P_1$ of gas injected through the discharging member 946 of the second electrode 940 such that the reactive gas can be prevented from moving into the gap (d) and concentration of the reactive gas plasma can be ensured more reliably.

Operations of elements in each procedure are illustrating in FIG. 49.

First, in stand-by mode, the substrate supporter 920 of the plasma processing apparatus 901 is moved upward toward the first electrode 930 (S1). Next, while air is being injected into the chamber 910 through a purge valve, the substrate supporter 920 is moved downward (S2). After an atmospheric pressure state is reached, the substrate 950 is introduced through the door unit 911 (S3).

The door unit 911 is closed, and then the substrate supporter 920 is moved upward (S4). Next, a vacuum is formed, and then inert gas is introduced (S5) and the gap (d) is adjusted (S6) and maintained (S7).

Thereafter, process gas is introduced (S8), and a desired process atmosphere is formed (S9). Then, high-frequency power is applied to perform a process (S10).

After the process, supplies of the process gas and the inert gas are interrupted (S11), and the gap (d) is re-adjusted to increase the gap (d) (S12).

After increasing the gap (d) (S13), the purge valve is opened (S14) to allow the chamber 910 to be in an atmospheric pressure condition, and then the substrate 50 is taken out from the chamber 910 (S15). Next, a vacuum is formed in the chamber 910 (S16), and the substrate supporter 920 is moved upward to a stand-by position.

FIG. 50 shows variations of etch rate and uniformity with respect to the distance (D).

Referring to FIG. 50, when the distance (D) is approximately 10 mm, the etch rate is highest, and approximately 5-percent uniformity is ensured.

However, when the distance (D) is greater than or smaller than approximately 10 mm, the etch rate and the uniformity deteriorate.

In the current embodiment, an etch rate of approximately 400 Å or higher and a uniformity of approximately 20% or lower are determined to be permissible.

Therefore, based on the results shown in FIG. 50, a lower limit of the distance (D) may be determined to be approximately 5 mm, and an upper limit of the distance (D) may be determined to be approximately 40 mm. If the distance (D) is less than approximately 5 mm, the etch rate is reduced to less than approximately 400 Å and if the distance (D) is greater than approximately 5 mm, both the etch rate and the uniformity deteriorate steeply.

FIG. 51 shows variations of etch rate and uniformity with respect to the process pressure of the plasma processing apparatus 901 during an etch process.

Referring to FIG. 51, although the etch rate increases in proportion to the process pressure, the uniformity is best when the process pressure is lower than approximately 1 Torr and is improved when the process pressure is higher than approximately 2 Torr. Here, the gap (d) and the distance (D) are restricted within the above-described ranges.

When the process pressure is approximately 2 Torr, the uniformity is approximately 13%. That is, the uniformity is improved around 2 Torr. Therefore, the process pressure may be kept in the range from approximately 0.1 Torr to approximately 3 Torr.

A separate pressure regulator can be provided to control the process pressure.

A restriction magnetic field can be additionally formed to restrict a plasma region. The restrict magnetic field may be formed using permanent magnets or a magnetic field inductor. If necessary, plasma formation efficiency can be improved by vibrating plasma ions using a magnetic field. In this case, the magnetic field may be varied according to the shapes of the chamber 910, the substrate 950, the first electrode 930, and the second electrode 940.

Instead of the high-frequency power supply 970, a direct current (DC) or alternating current (AC) power supply may be used for supply power to the second electrode 940. A unipolar or bipolar pulse power supply may be used. Electric connection between the first electrode 930 and the second electrode 940 may be varied according the type of the power supply, and an additional member may be used for applying power.

After the etch process, power is interrupted, and supplies of the reactive gas and the non-reactive gas are interrupted. Then, byproducts of the etch process are removed through a vacuum ventilation process. Here, since the byproducts are gases produced by reaction with the radicals of plasma, the byproducts can be sufficiently removed only by the vacuum ventilation process.

After the byproducts are removed, the second electrode 940 is moved down using the driving unit 949, and the substrate 950 is moved away from the first electrode 930 using the driving unit of the substrate supporter 920.

Thereafter, the vacuum is broken, and the door unit 911 is opened. Then, the substrate 950 is taken out. In this way the entire etch process is completed.

Although the organic the apparatus for plasma processing and the method for plasma processing have been described with reference to the specific embodiments, they are not limited thereto. Therefore, it will be readily understood by those skilled in the art that various modifications and changes can be made thereto without departing from the spirit and scope of the present invention defined by the appended claims.

As described above, there are provided a substrate supporter and a plasma processing apparatus having the same capable of performing expeditious etching by using a smaller apparatus compared with a wet etching, reducing fabrication cost, and preventing generation of environmentally toxic waste.

There are also provided a substrate supporter and a plasma processing apparatus having the same that reduce the likelihood of arc discharges compared with conventional dry etching to increase process yield and product reliability, and ensure stable mounting of a substrate.

In addition, a plasma processing apparatus and a method for plasma processing using the same, when compared with a conventional dry etching, efficiently protects a surface of a substrate which is not required to be etched, and thereby increases yield of final products and reduces the rate of defects.

The invention claimed is:

1. An apparatus for plasma processing, comprising:
a first electrode unit configured to inject a first gas;
a substrate supporter spaced apart from the first electrode unit for supporting a substrate; and
a second electrode unit spaced apart from the substrate supporter to be arranged at a backside of the substrate, the second electrode unit configured to inject a second gas to form plasma between the second electrode unit and the substrate supported on the substrate supporter;
a plurality of discharging nozzles formed in the second electrode unit to inject the second gas toward the backside of the substrate;
an insulating ring formed along a peripheral portion of the second electrode unit to concentrate plasma formed between the second electrode unit and the substrate;
a discharging member integrally formed with the second electrode unit at the peripheral portion of the second electrode unit and extending toward the first electrode to inject a third gas toward a center portion of the second electrode unit or a center of the substrate and to confine the second gas;
wherein the substrate supporter comprises:
one or more arms configured to receive the substrate; and
a supporting part extending from the arm toward a substrate seating position of the substrate;
wherein the supporting part comprises:
a supporting ring configured to connect the arms and having an opening;
an auxiliary ring disposed at the opening of the supporting ring; and
an auxiliary arm connected to the auxiliary ring and configured to move the auxiliary ring to the opening of the supporting ring so that the supporting ring and the auxiliary ring form a closed portion;
wherein the discharging member has a bent shape, wherein a top portion of the discharging member is angled toward the center portion of the second electrode unit to cause the third gas to be injected toward the center portion of the second electrode unit.

2. The apparatus of claim 1, comprising:
a chamber having the first electrode, the substrate supporter and second electrode therein;
wherein the arm of the substrate supporter extends from an upper part of the chamber or a lower part of the chamber.

3. The apparatus of claim 2, wherein the substrate supporter is configured to support the substrate by using an upwardly and downwardly movable arm extending from an upper or lower portion of the chamber, or by using a plurality of upwardly and downwardly movable pins disposed at the lower portion of the chamber.

4. The apparatus of claim 1, wherein the supporting ring further comprises a plurality of pins extending in a substrate seating direction.

5. The apparatus of claim 1, further comprising a driving unit disposed at at least one of the first electrode, the second electrode, and the substrate supporter for adjusting a distance between the first electrode and the substrate supporter or a distance between the second electrode and the substrate supporter.

6. The apparatus of claim 1, wherein the first gas is a non-reactive gas, and the second gas is a reactive gas.

7. The apparatus of claim 1, wherein the first electrode unit comprises a discharge nozzle configured to allow the first gas to flow toward a peripheral region of the substrate, the discharge nozzle being sloped toward the peripheral region of the substrate.

8. The apparatus of claim 7, wherein the discharge nozzle of the first electrode unit diverges or converges toward the peripheral region of the substrate.

9. The apparatus of claim 7, wherein the discharge nozzle of the first electrode unit comprises a plurality of nozzles branching from a supply nozzle, and the nozzles are arranged to be equiangular to each other with respect to the supply nozzle or formed in an annular shape concentrically around the supply nozzle.

* * * * *